(12) United States Patent
Greenlee et al.

(10) Patent No.: US 12,274,063 B2
(45) Date of Patent: *Apr. 8, 2025

(54) INTEGRATED ASSEMBLIES AND METHODS OF FORMING INTEGRATED ASSEMBLIES

(71) Applicant: Lodestar Licensing Group LLC, Evanston, IL (US)

(72) Inventors: Jordan D. Greenlee, Boise, ID (US); John D. Hopkins, Meridian, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/384,455

(22) Filed: Oct. 27, 2023

(65) Prior Publication Data

US 2024/0057335 A1 Feb. 15, 2024

Related U.S. Application Data

(60) Continuation of application No. 17/854,393, filed on Jun. 30, 2022, now Pat. No. 11,805,651, which is a
(Continued)

(51) Int. Cl.
*H10B 43/27* (2023.01)
*H01L 21/02* (2006.01)
*H01L 21/28* (2006.01)
*H01L 21/311* (2006.01)
*H10B 41/10* (2023.01)
(Continued)

(52) U.S. Cl.
CPC ....... *H10B 43/27* (2023.02); *H01L 21/02129* (2013.01); *H01L 21/02164* (2013.01); *H01L 21/0217* (2013.01); *H01L 21/02636* (2013.01); *H01L 21/31111* (2013.01); *H01L 29/40114* (2019.08); *H01L 29/40117* (2019.08);
(Continued)

(58) Field of Classification Search
CPC ........ H01L 27/11582; H01L 29/40114; H01L 29/40117; H01L 21/02129; H01L 21/02164; H01L 21/0217; H01L 21/02636; H01L 21/31111; H01L 27/11519; H01L 27/11556; H01L 27/11565

See application file for complete search history.

(56) References Cited

U.S. PATENT DOCUMENTS 11,805,651 B2 * 10/2023 Greenlee ........... H01L 21/31111
2021/0217775 A1 * 7/2021 Zhang ............... H01L 29/40111
2021/0358890 A1 * 11/2021 Hu ........................ H10B 41/10

* cited by examiner

*Primary Examiner* — Monica D Harrison
*Assistant Examiner* — Andre C Stevenson
(74) *Attorney, Agent, or Firm* — Brooks, Cameron & Huebsch, PLLC

(57) ABSTRACT

Some embodiments include an integrated assembly having a second deck over a first deck. The first deck has first memory cell levels, and the second deck has second memory cell levels. A pair of cell-material-pillars pass through the first and second decks. Memory cells are along the first and second memory cell levels. The cell-material-pillars are a first pillar and a second pillar. An intermediate level is between the first and second decks. The intermediate level includes a region between the first and second pillars. The region includes a first segment adjacent the first pillar, a second segment adjacent the second pillar, and a third segment between the first and second segments. The first and second segments include a first composition, and the third segment includes a second composition different from the first composition. Some embodiments include methods of forming integrated assemblies.

20 Claims, 22 Drawing Sheets

Related U.S. Application Data division of application No. 16/890,726, filed on Jun. 2, 2020, now Pat. No. 11,411,021.

(51) Int. Cl.
  *H10B 41/27*  (2023.01)
  *H10B 43/10*  (2023.01)

(52) U.S. Cl.
  CPC .............. *H10B 41/10* (2023.02); *H10B 41/27* (2023.02); *H10B 43/10* (2023.02)

INTEGRATED ASSEMBLIES AND METHODS OF FORMING INTEGRATED ASSEMBLIES

PRIORITY INFORMATION

This application is a Continuation of U.S. application Ser. No. 17/854,393, filed on Jun. 30, 2022, which is a Divisional of U.S. application Ser. No. 16/890,726 filed on Jun. 2, 2020, which issued as U.S. Pat. No. 11,411,021 on Aug. 9, 2022, the contents of which are incorporated herein by reference.

TECHNICAL FIELD

Integrated assemblies (e.g., NAND-containing assemblies), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device 210<sub>1</sub> is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device 212<sub>1</sub> is connected to the bitline $228_1$. The source of each drain-select device 212 is connected to the drain of the last charge-storage transistor 208 of the corresponding NAND string 206. For example, the source of drain-select device 212<sub>1</sub> is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Some embodiments include methods of forming memory with two or more decks stacked one atop another, and some embodiments include configurations having two or more decks stacked one atop another. Example embodiments are described with reference to FIGS. 5-21.

Figure 1:
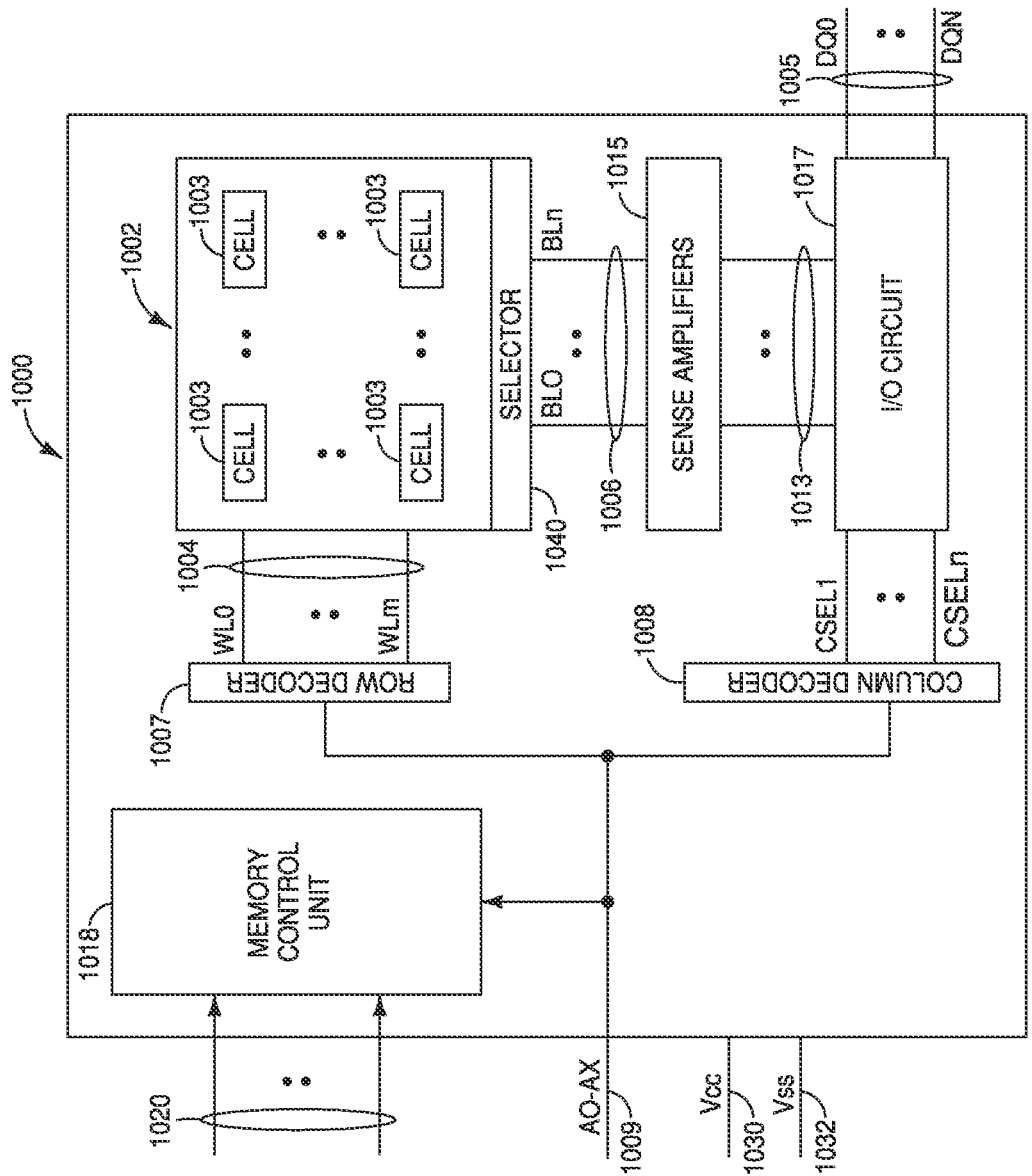
FIG. 1 shows a block diagram of a prior art memory device having a memory array with memory cells.
Figure 2:
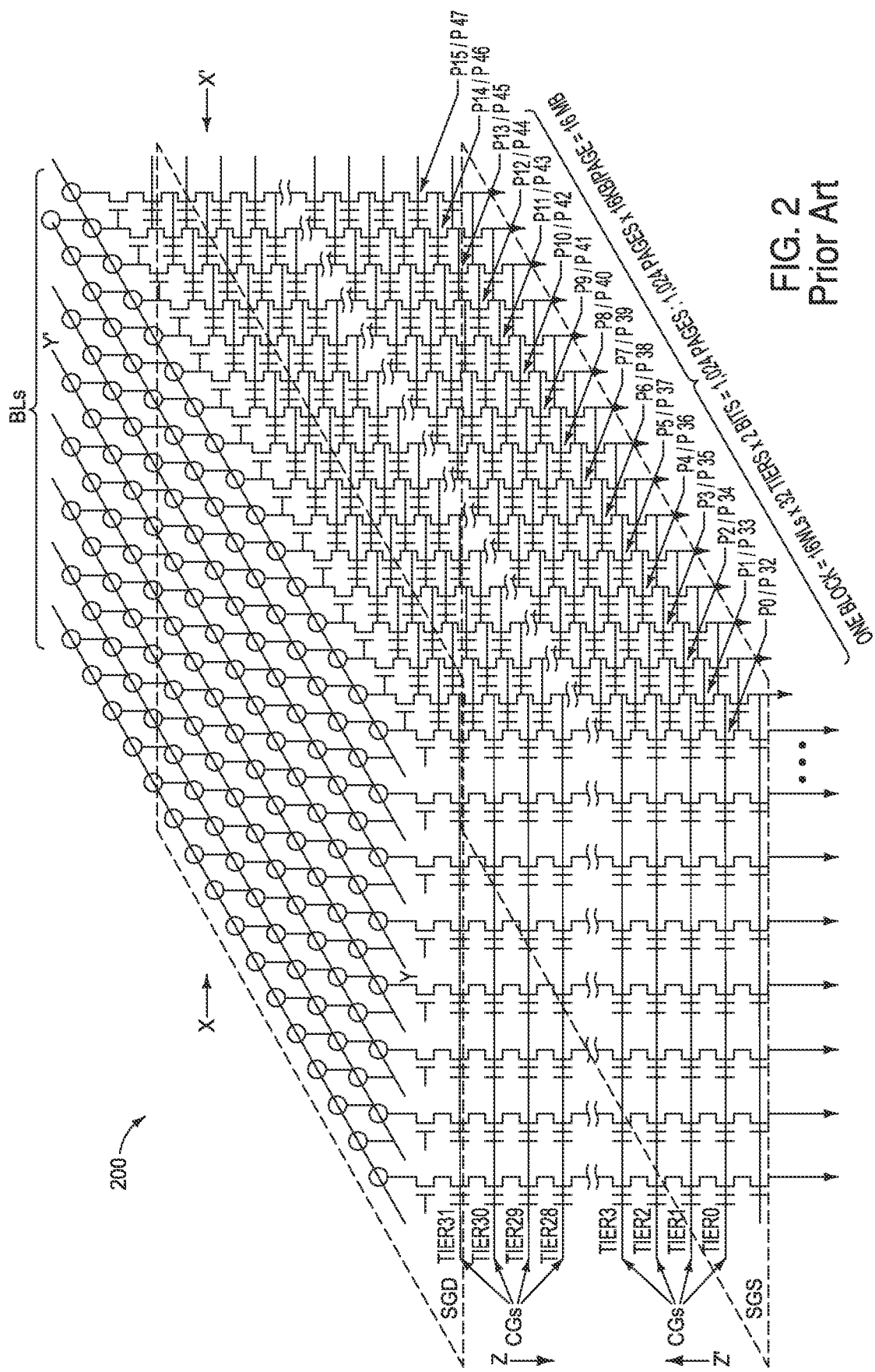
FIG. 2 shows a schematic diagram of the prior art memory array of FIG. 1 in the form of a 3D NAND memory device.
Figure 3:
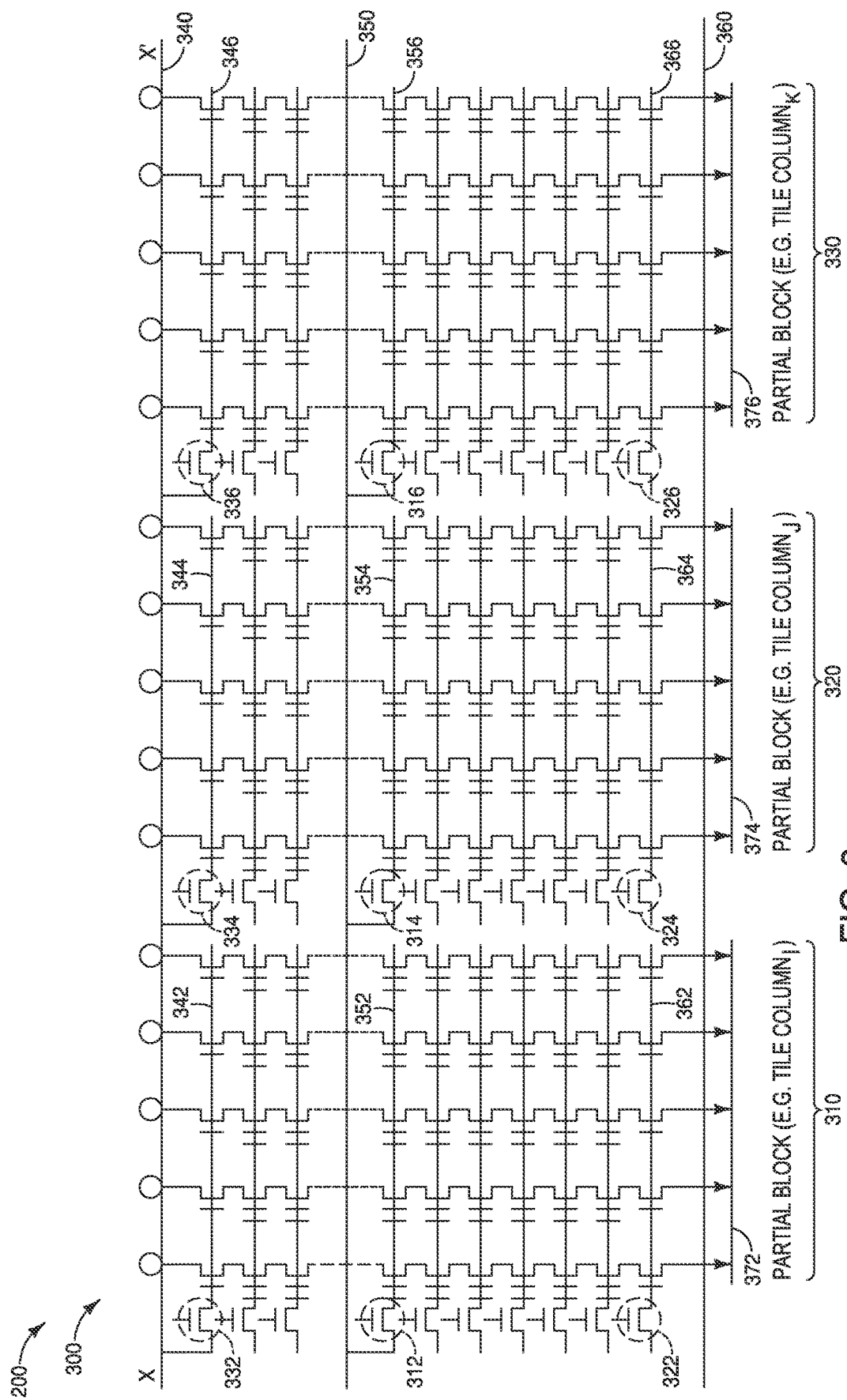
FIG. 3 shows a cross-sectional view of the prior art 3D NAND memory device of FIG. 2 in an X-X' direction.
Figure 4:
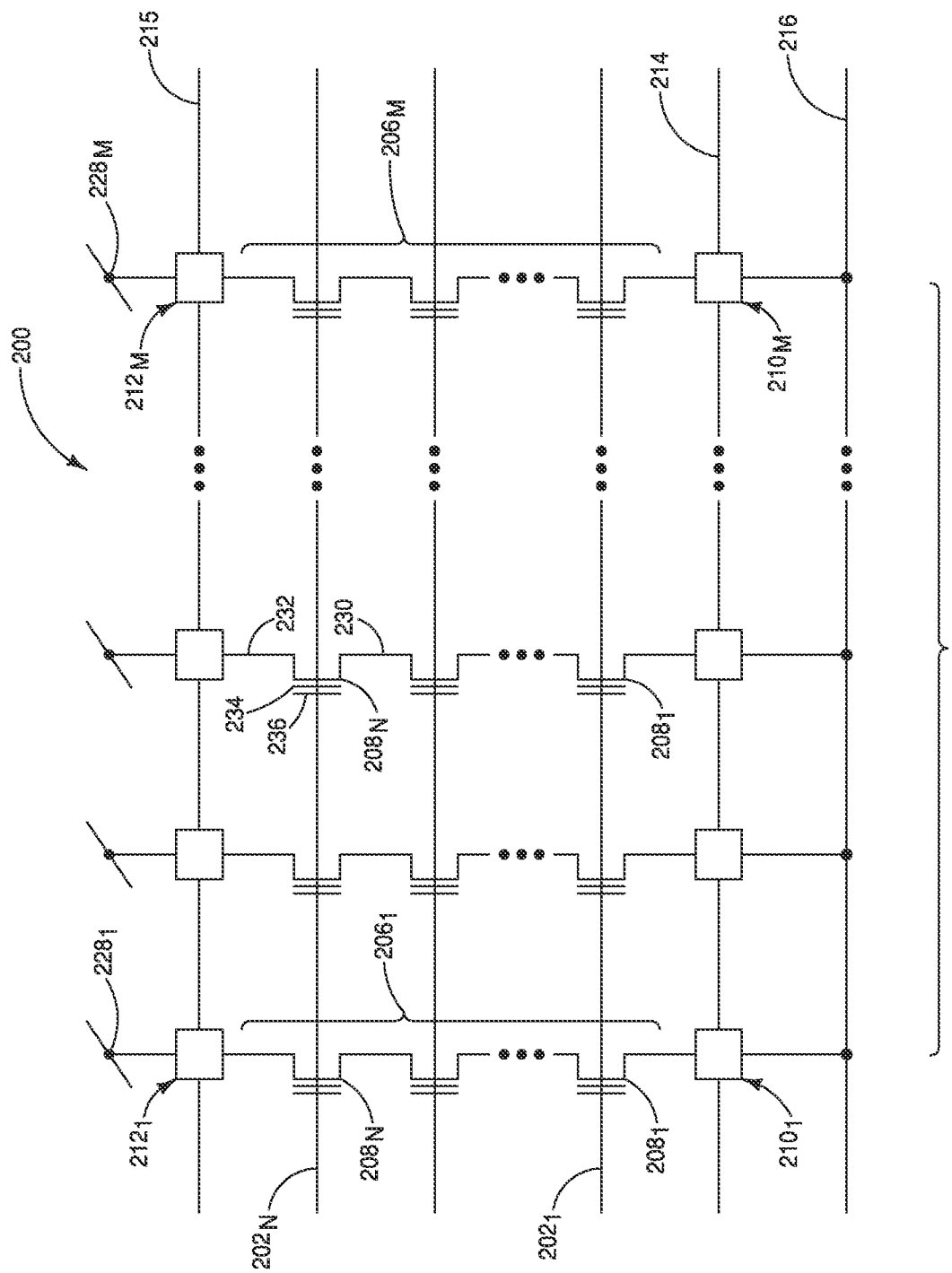
FIG. 4 is a schematic diagram of a prior art NAND memory array.
Figure 5:
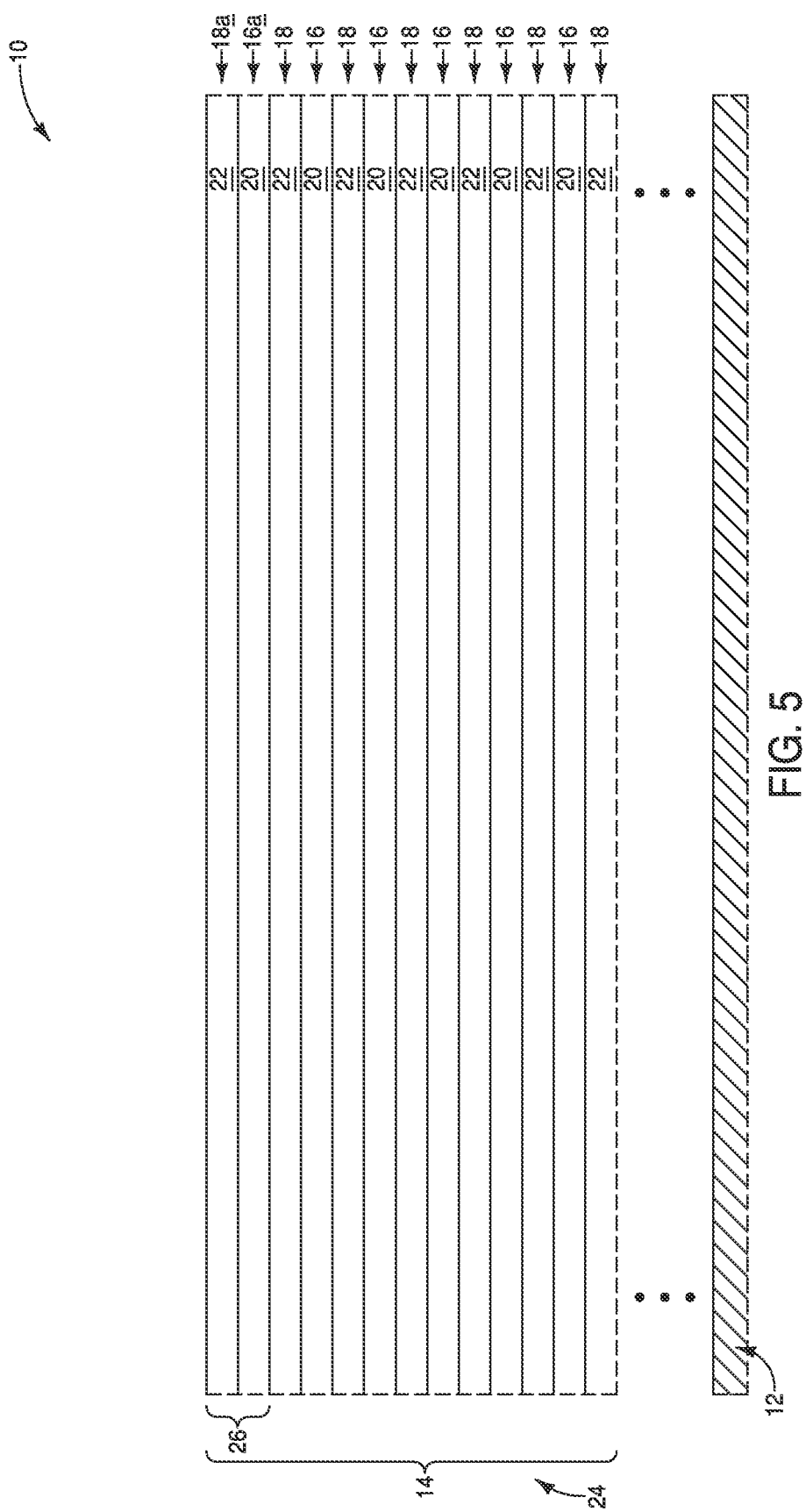
FIGS. 5-16 are diagrammatic cross-sectional side views of a region of an integrated assembly at example sequential process stages of an example method for forming an example memory array.

Referring to FIG. 5, an integrated assembly 10 includes a conductive structure 12. The conductive structure 12 may be a source structure analogous to the source structures described above in the Background section. The conductive structure 12 may comprise any suitable electrically conductive composition(s), and in some embodiments may comprise conductively-doped semiconductor material (e.g., n-type silicon) over metal-containing material (e.g., one or both of tungsten and tungsten silicide).

The source structure 12 may be supported by a semiconductor substrate (base). The semiconductor substrate is not shown in the figures of this disclosure to simplify the drawings. The semiconductor substrate may comprise any suitable semiconductor composition(s); and in some embodiments may comprise monocrystalline silicon.

A stack 14 of alternating first and second tiers (levels, layers) 16 and 18 is formed over the conductive structure 12. The stack 14 may comprise any suitable number of alternating tiers 16 and 18. The first tiers 16 ultimately become conductive levels of a memory arrangement. There may be any suitable number of tiers 16 to form the desired number of conductive levels. In some embodiments, the number of tiers 16 may be 8, 16, 32, 64, etc.

The first tiers 16 comprise a first material 20. Such first material may comprise any suitable composition(s), and in some embodiments may comprise, consist essentially of, or consist of silicon nitride.

The second tiers 18 comprise a second material 22. Such material may be an insulative material, and may comprise any suitable composition(s). In some embodiments, the second material 22 may comprise, consist essentially of, or consist of silicon dioxide.

In some embodiments, the materials 20 and 22 may be referred to as a first material and an insulative second material, respectively.

The tiers 16 and 18 may be of any suitable thicknesses; and may be the same thickness as one another, or may be different thicknesses relative to one another. In some embodiments, the tiers 16 and 18 may have vertical thicknesses within a range of from about 10 nanometers (nm) to about 400 nm.

The stack 14 is spaced from the conductive structure 12 by a gap. Such gap is utilized to indicate that there may be one or more additional components, structures, etc., between the illustrated region of the stack 14 and the conductive structure 12. Such additional structures may include, for example, source-side select gate (SGS) structures.

One of the first tiers 16 is an uppermost of the first tiers, and is labeled as 16a to distinguish it from the other first tiers.

One of the second tiers is an uppermost of the second tiers, and is labeled as 18a to distinguish it from the other second tiers. The uppermost second tier 18a is over the uppermost first tier 16a.

The stack 14 may be referred to as a first stack. A first deck 24 may be considered to include at least a portion of the first stack 14. In some embodiments, the first deck 24 may include the entirety of the first stack 14. In some embodiments, the first deck 24 may be considered to include the portion of the stack 14 beneath the uppermost levels 16a and 18a, and the levels 16a and 18a may be considered to correspond to a region 26 over the first deck 24. The region 26 may be referred to as an intermediate region.

Figure 6:
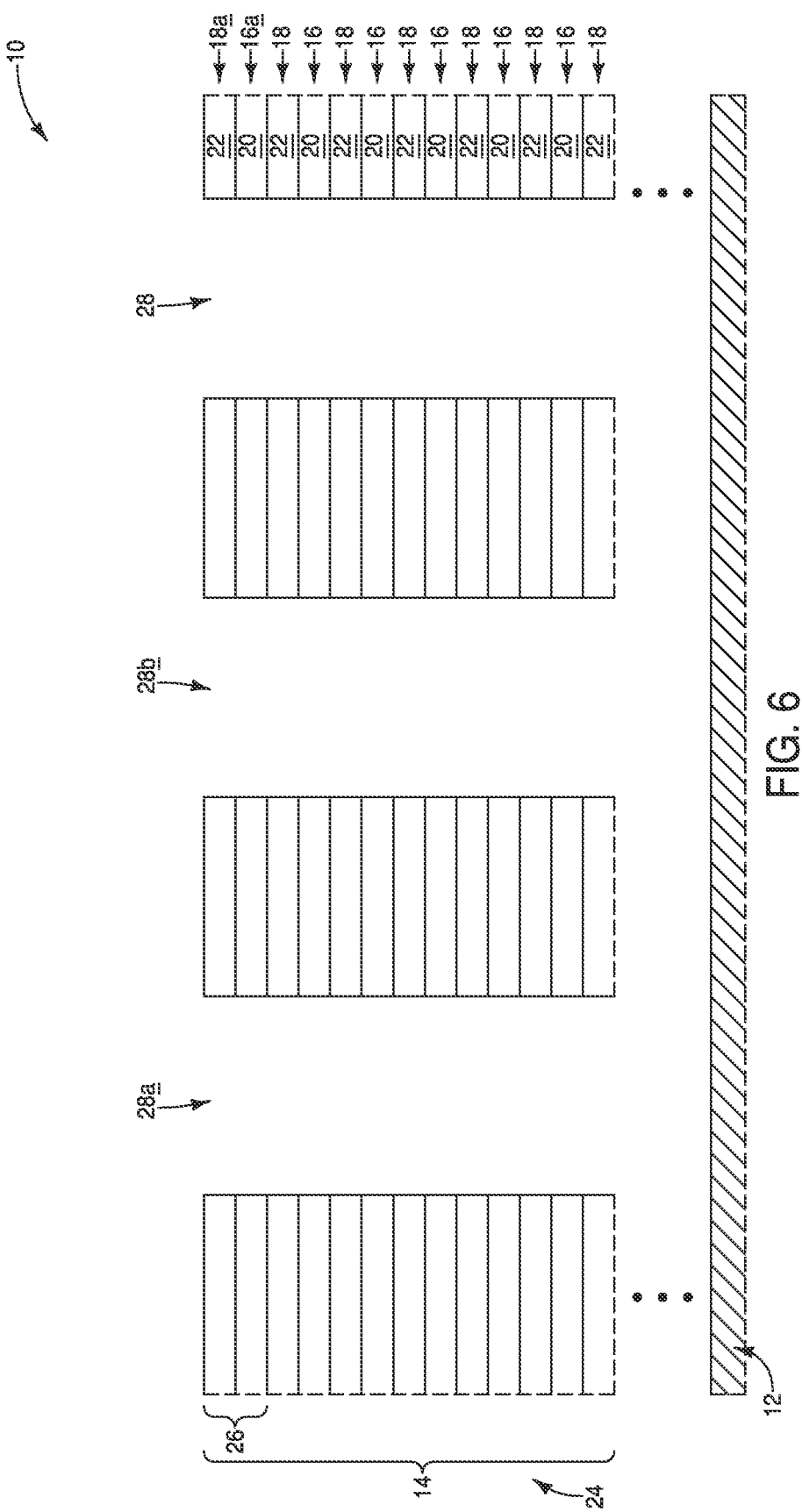

Referring to FIG. 6, openings 28 are formed to extend through the stack 14. Two of the openings 28 may be considered together as a pair of the openings, with such pair including an opening 28a and an opening 28b. The opening 28b is a neighbor to the opening 28a along the cross-section of FIG. 6.

The openings 28 may be referred to as first openings.

Figure 7:
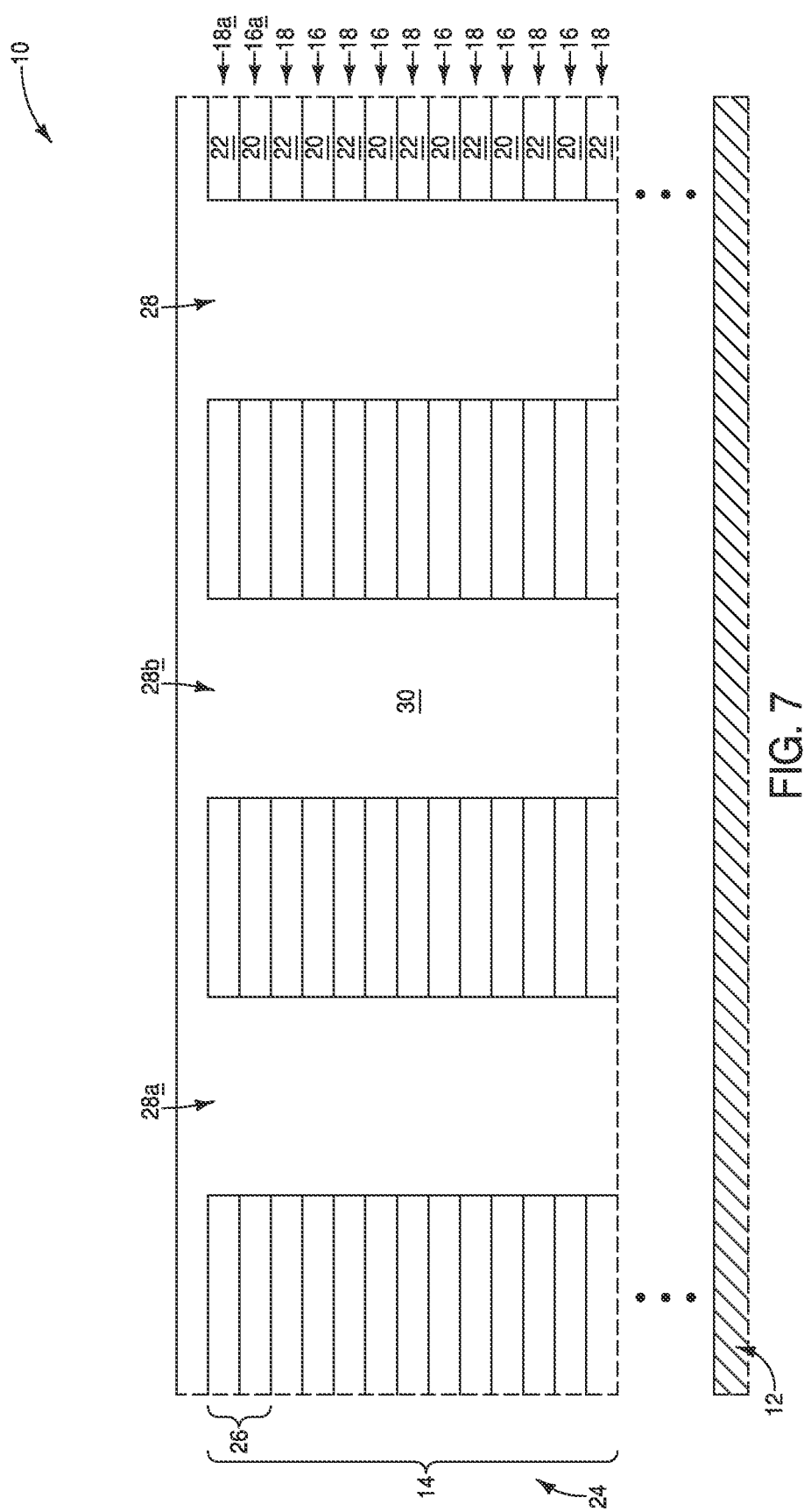

Referring to FIG. 7, fill material 30 is formed within the openings 28. The fill material may comprise any suitable composition(s); and in some embodiments may comprise, consist essentially of, or consist of one or more of doped silicate glass (e.g., borophosphosilicate glass, fluorosilicate glass, etc.), aluminum oxide, metal (e.g., tungsten, titanium, etc.), metal oxide (e.g., tantalum oxide, titanium oxide, etc.) and silicon. The silicon may be in any suitable crystalline form (e.g., polycrystalline, amorphous, etc.). The silicon may have little, if any, conductivity-enhancing dopant therein (e.g., may have less than or equal to about $1 \times 10^{18}$ atoms/cm$^3$ of conductivity-enhancing dopant therein), with example conductivity-enhancing dopants including phosphorus, boron, arsenic, etc. Accordingly, the silicon may be effectively undoped, and may therefore be nonconductive.

The fill material 30 entirely fills the openings 28, and in the illustrated embodiment extends across the uppermost tier 18a. In some embodiments, the fill material 30 may be removed from over the uppermost tier 18a with a planarization process (e.g., chemical-mechanical polishing, CMP).

Figure 8:
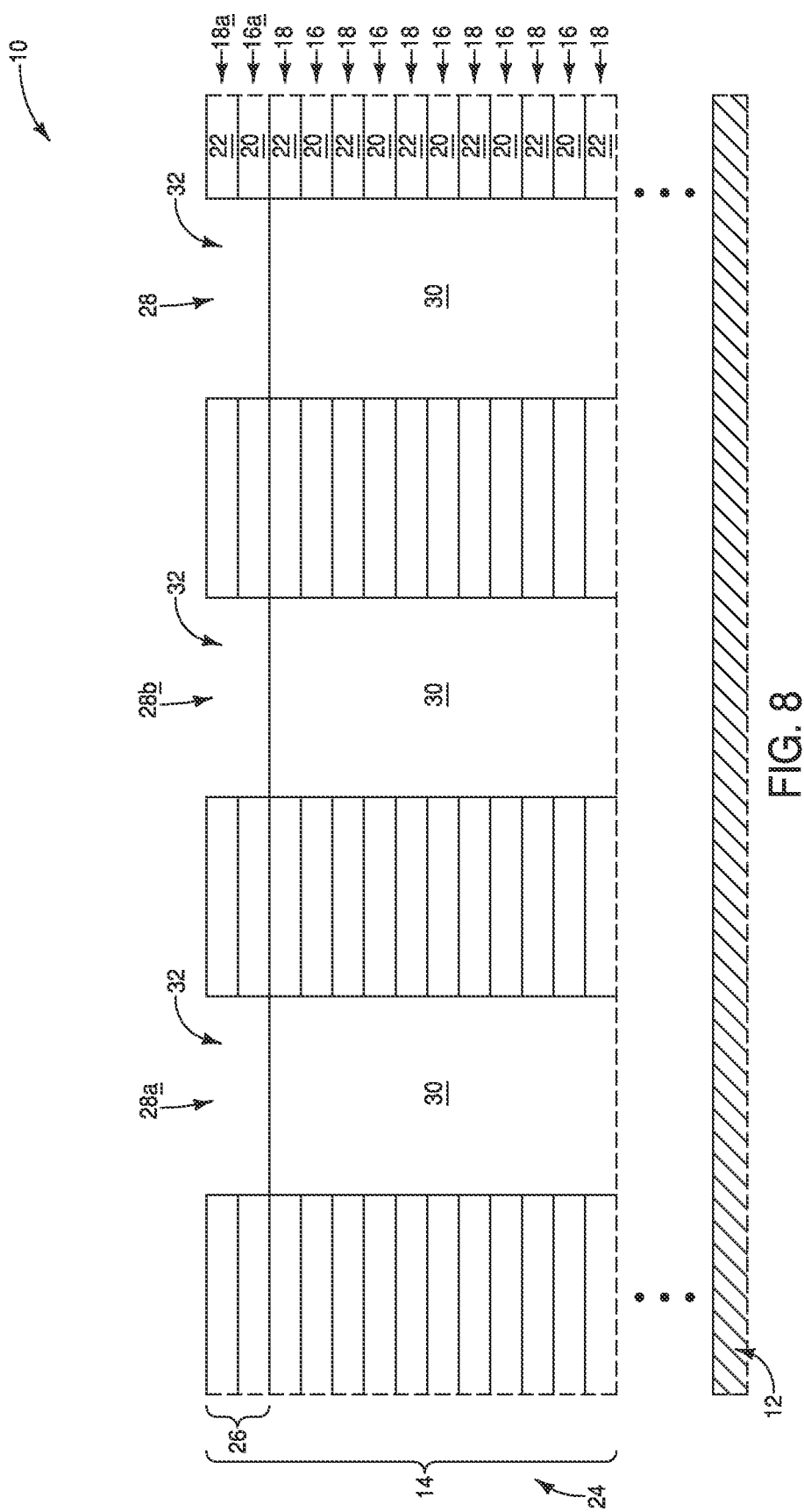

Referring to FIG. 8, upper portions of the fill material 30 are removed from within the openings 28 to reopen upper regions 32 of the openings. The reopened upper regions 32 of the openings 28 are along the intermediate region 26, and expose sidewalls of the uppermost tiers 16a and 18a. Although the illustrated embodiment only has two of the tiers 16 and 18 within the intermediate region 26, in other embodiments more than two of the tiers may be within the intermediate region and may have sidewalls exposed at the process stage of FIG. 8.

Figure 9:
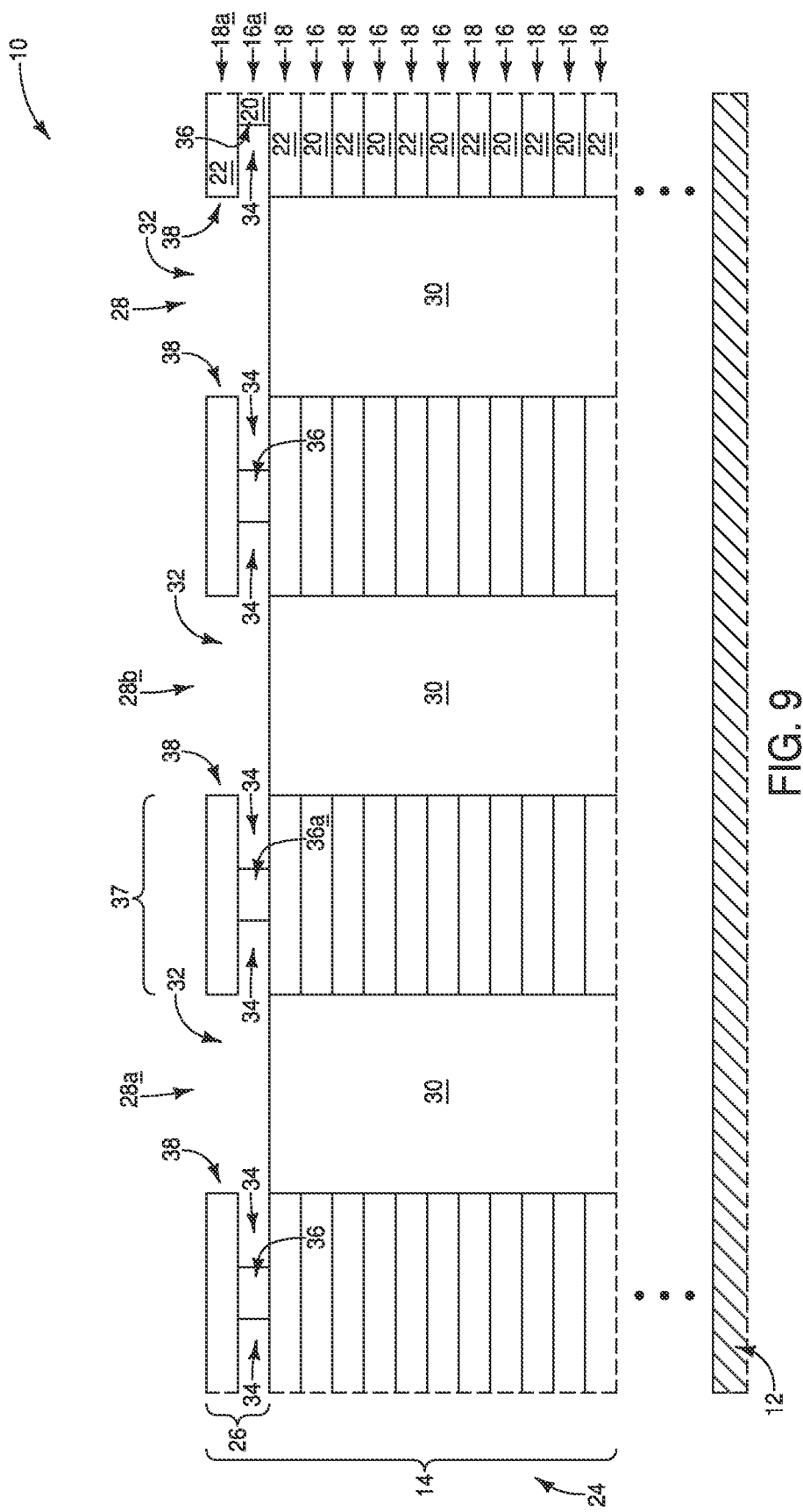

Referring to FIG. 9, etchant is flowed into the upper regions 32 of the openings 28, and is utilized to recess the material 20 of the uppermost first tier 16a. In some embodiments, the material 20 comprises silicon nitride and the etchant comprises phosphoric acid.

The material 20 of the uppermost first tier 16a is recessed from sidewalls of the openings 28 to form cavities 34 extending into the uppermost first tier 16a. Some of the material 20 of the tier 16a remains, and is configured as segments (regions, structures, pillars) 36 between the cavities. One of the segments 36 is labeled 36a, and is in a region 37 between the first and second openings 28a and 28b along the cross-section of FIG. 9.

Beams (horizontally-elongated structures, segments) 38 of the insulative material 22 within the uppermost insulative tier 18a are supported by the segments 36.

Figure 10:
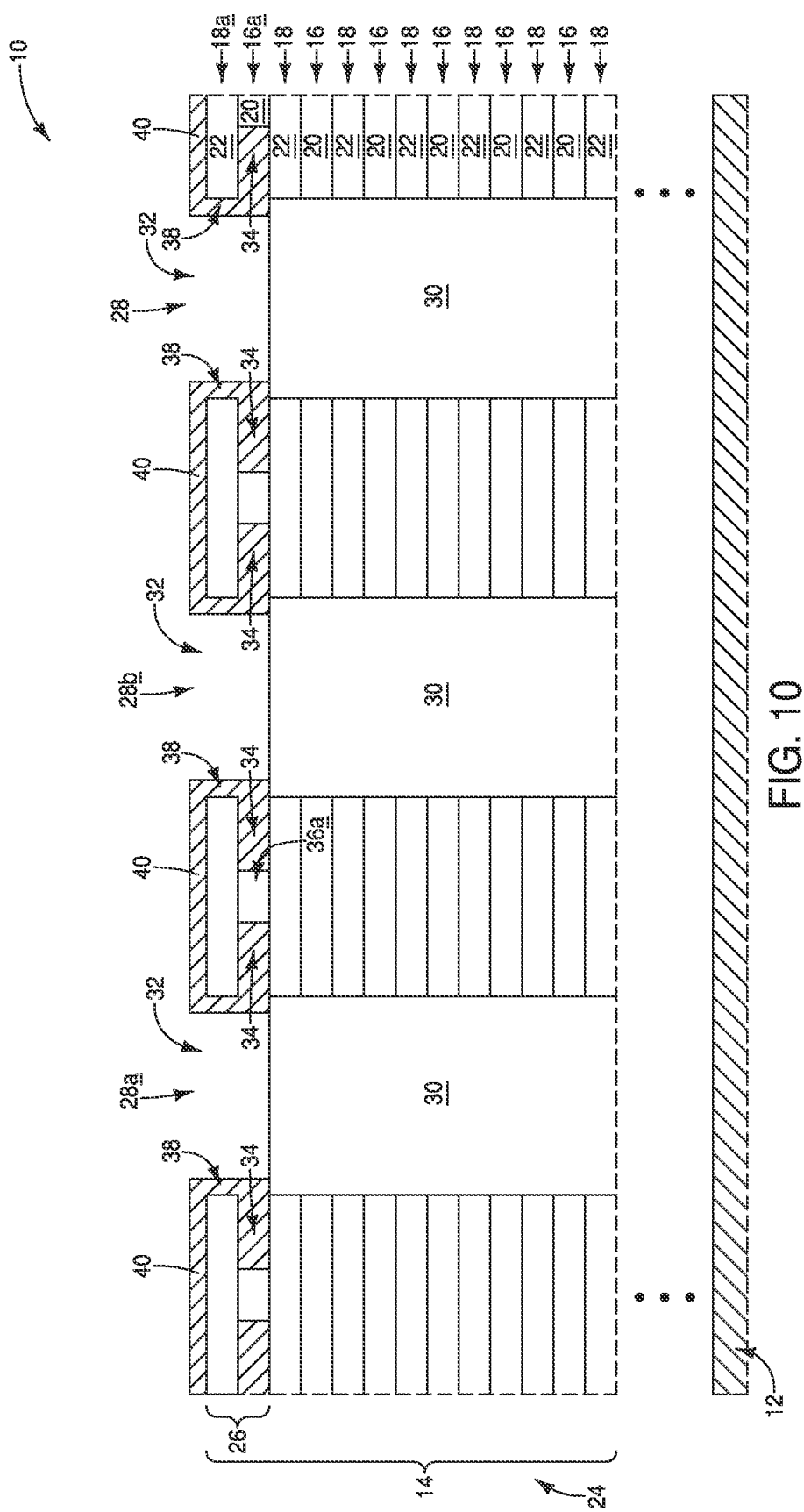

Referring to FIG. 10, material 40 is formed to extend around the beams 38 and within the cavities 34. The material 40 may be referred to as plug material, fill material, stop material, etc. The material 40 may comprise any suitable composition(s). In some embodiments, the material 40 may comprise metal. For instance, the material 40 may comprise, consist essentially of, or consist of one or more of Ti, W, Co, Ni, Nb, Ta, Mo, Hf, Zr, Mg, Al, Fe and PT. In some embodiments, the material 40 may comprise, consist essentially of, or consist of one or more of metal oxide, metal nitride, metal boride and metal silicide. For instance, the material 40 may comprise one or both of TiN and WN, where the chemical formulas indicate primary constituents rather than specific stoichiometries. In some embodiments the material 40 may comprise semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). If the material 40 comprises silicon, the silicon may be conductively-doped (i.e., may comprise a dopant concentration of at least about $1 \times 10^{20}$ atoms/cm$^3$), or may not be conductively-doped. The dopant utilized within the silicon-containing material 40 may be any suitable dopant, including, for example, one or more of arsenic, boron, phosphorus, etc.

The material 40 is shown with crosshatching to help the reader visualize such material relative to the other materials of FIG. 10, and to diagrammatically indicate that the material 40 may be conductive in some embodiments.

The material 40 is shown to only partially fill the upper regions 32 of the openings 28, and to thereby narrow such upper regions. In other embodiments the material 40 may entirely fill the upper regions 32 of the openings 28.

Figure 11:
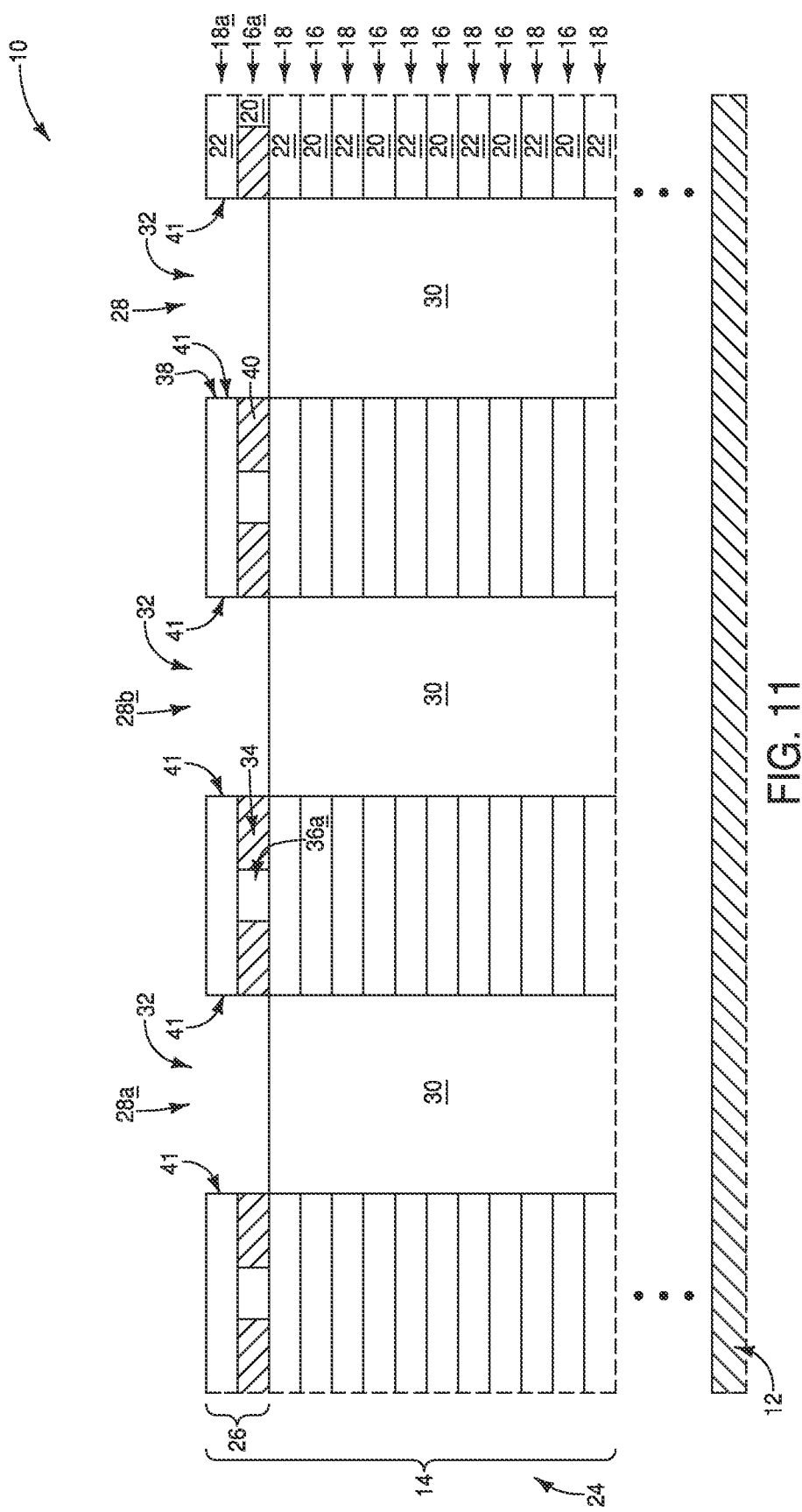

Referring to FIG. 11, an anisotropic etch is utilized to remove the material 40 from over upper surfaces of the beams 38, and from edges of the openings 28, while leaving the material 40 within the cavities 34. The configuration of FIG. 11 has the upper regions 32 of the openings 28 extending through the uppermost first and second tiers 16a and 18a. The upper regions 32 of the openings 28 have sidewalls 41 which comprise both the material 40 and the material 22.

Figure 12:
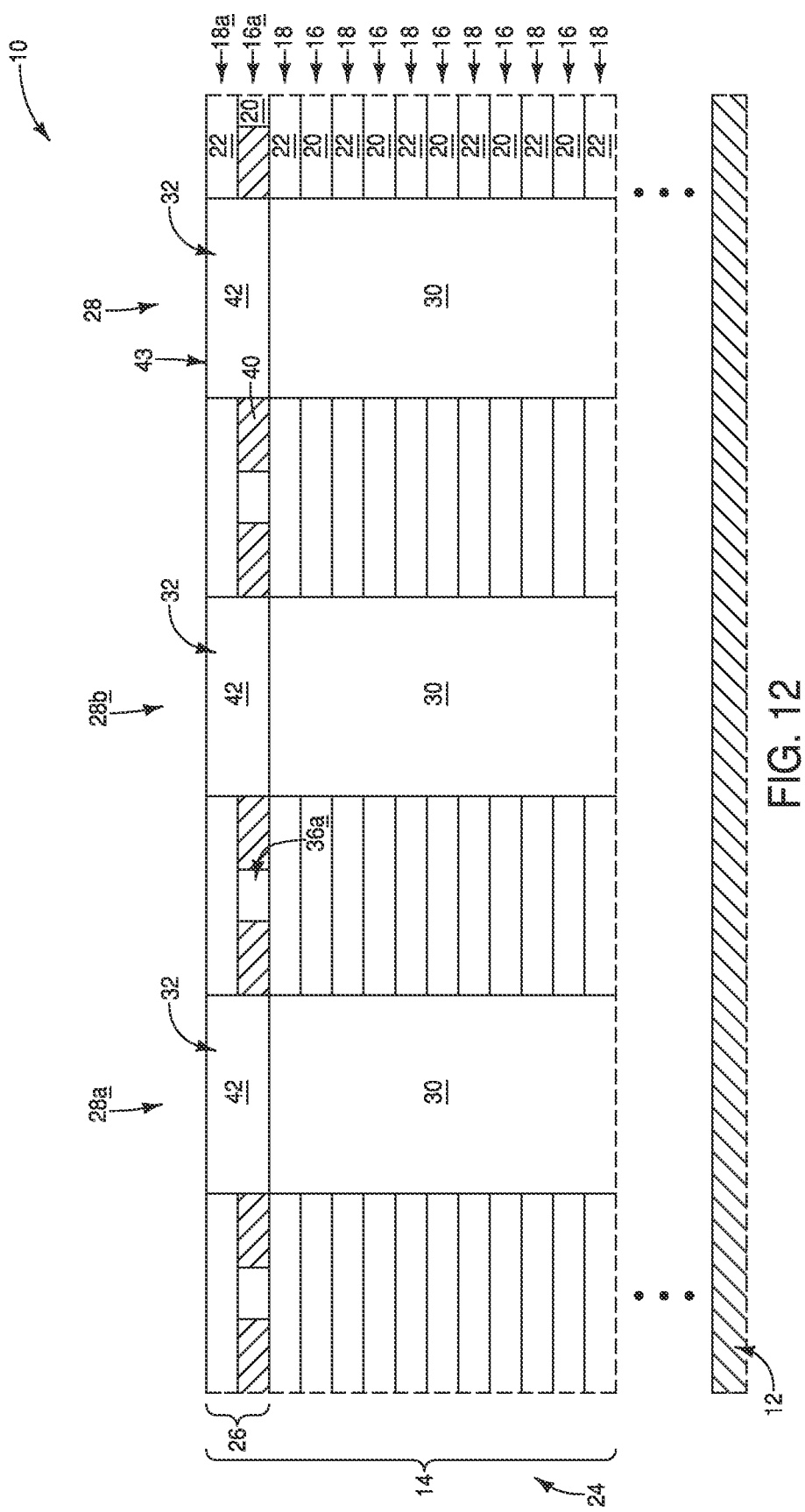

Referring to FIG. 12, material 42 is formed within the upper regions 32 of the openings 28. The material 42 may be referred to as plug material, stop material, etc. In some embodiments, the material 42 may be referred to as a second plug material to distinguish it from the first plug material 40.

The material 42 may comprise any suitable composition(s). For instance, the material 42 may comprise any of the compositions described above as being suitable for the fill material 30. In some embodiments the material 42 may comprise a same composition as the fill material 30, and in other embodiments the material 42 may comprise a different composition than the fill material 30. In some embodiments, the material 42 may comprise silicon having no more than about $1 \times 10^{18}$ atoms/cm$^3$ of conductivity-enhancing dopant therein. In some embodiments, the material 42 may comprise one or more of doped silicate glass (e.g., borophosphosilicate glass, fluorosilicate glass, etc.), aluminum oxide, etc.

A planarized surface 43 is formed to extend across the materials 22 and 42. The planarized surface may be formed with any suitable processing, including, for example, CMP.

Figure 13:
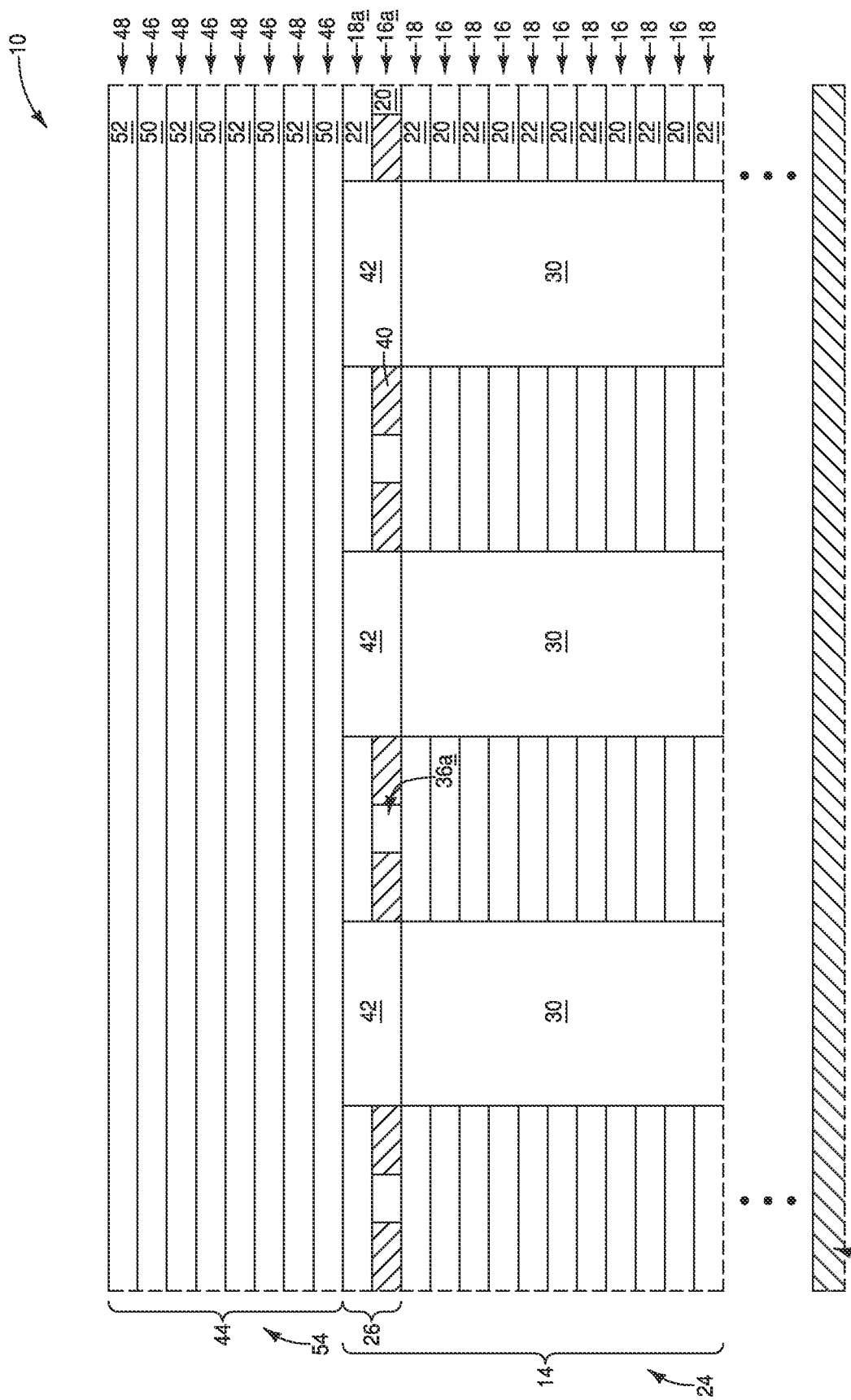

Referring to FIG. 13, a second stack 44 of alternating third and fourth tiers (levels, layers) 46 and 48 is formed over the first stack 14. The stack 44 may comprise any suitable number of alternating tiers 46 and 48. The third tiers 46 ultimately become conductive levels of a memory arrangement. There may be any suitable number of tiers 46 to form the desired number of conductive levels. In some embodiments, the number of tiers 46 may be 8, 16, 32, 64, etc.

The third tiers 46 comprise a third material 50. Such third material may comprise any suitable composition(s), and in some embodiments may comprise, consist essentially of, or consist of silicon nitride. Accordingly, the third material 50 may comprise a same composition as the first material 20.

The fourth tiers 48 comprise a fourth material 52. Such material may be an insulative material, and may comprise any suitable composition(s). In some embodiments, the fourth material 52 may comprise, consist essentially of, or consist of silicon dioxide. In some embodiments, the insulative fourth material 52 may comprise a same composition as the insulative second material 22.

The tiers 46 and 48 may have the same thicknesses described above relative to the tiers 20 and 22.

The second stack 44 may be considered to be comprised by a second deck 54.

Figure 14:
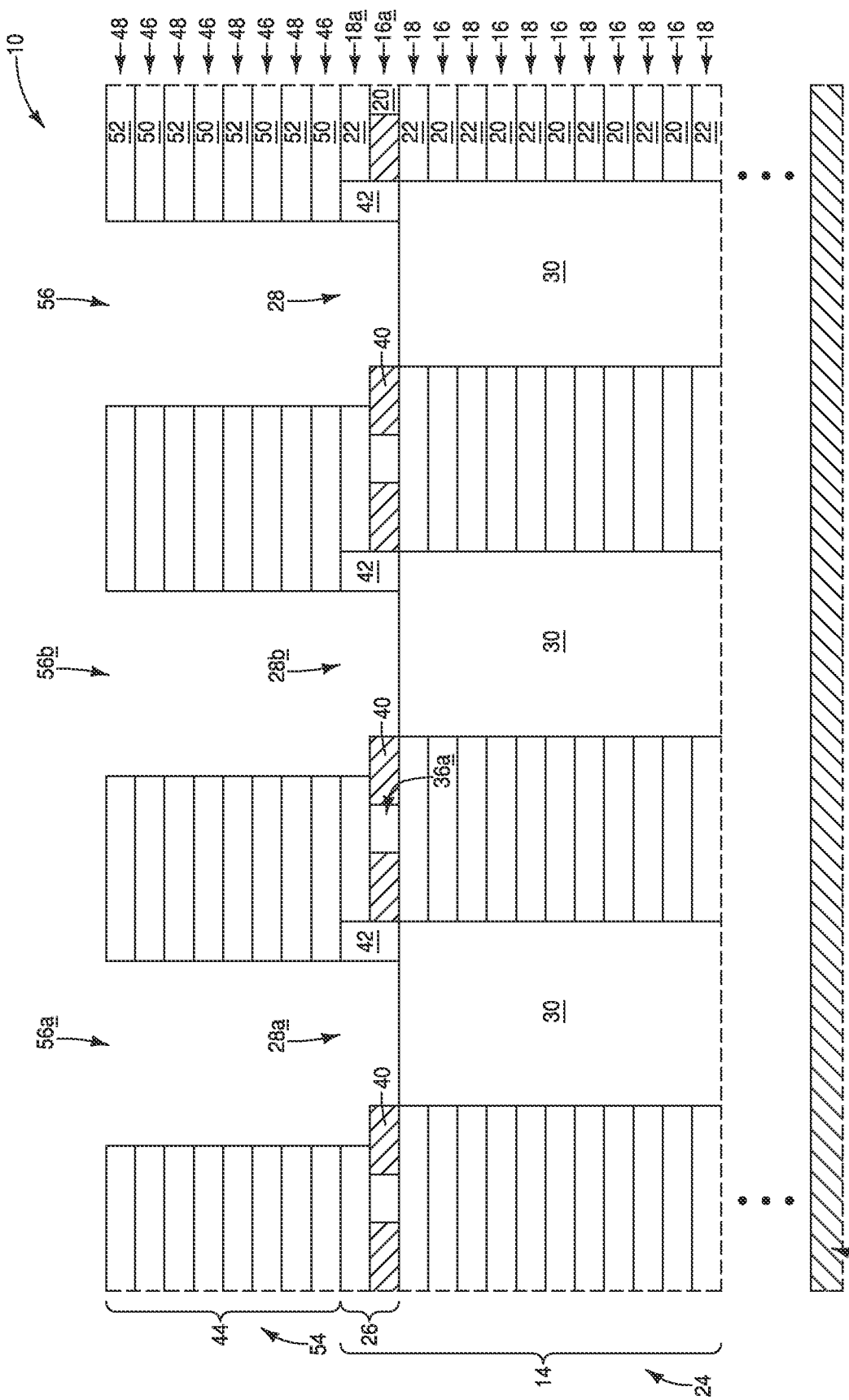

Referring to FIG. 14, second openings 56 are formed to extend through the second stack 44. The second openings 56 extend through the second plug material 42 to the fill material 30. The plug material 42 and the fill material 30 are within the first openings 28. Accordingly, the second openings 56 may be considered to be extended through the second stack 44 to the first openings 28.

Two of the openings 56 may be considered together as a pair of the openings, with such pair including an opening 56a and an opening 56b. The opening 56b is a neighbor to the opening 56a along the cross-section of FIG. 14. The openings 56a and 56b extend to the openings 28a and 28b, respectively.

The second openings 56 are misaligned relative to the first openings 28 in the illustrated embodiment of FIG. 14. In other embodiments, the second openings 56 may be aligned relative to the first openings 28 (as described in more detail below with reference to FIGS. 20 and 21). The material 40 forms a hard stop (i.e., an etch stop) so that the misaligned regions of the second openings 56 do not penetrate through the intermediate region 26 into underlying materials of the first stack 14. Such may avoid problems associated with conventional processes (i.e., processes lacking the material 40 of the region 26). The problems may include shaving of materials 20 and 22 within an upper region of the second stack 14 due to the misaligned portions of openings 56 leading to removal of regions of such materials. The shaving may adversely impact the configuration of structures which are subsequently formed within openings 28/56, which may lead to impaired device performance, or even to inoperable devices. Accordingly, the processing described herein may advantageously alleviate or prevent problems associated with conventional fabrication processes.

The configuration of FIG. 14 may be formed by initially forming the openings 56 to extend to an upper surface of the plug material 42, and then extending the openings 56 through the plug material.

Figure 15:
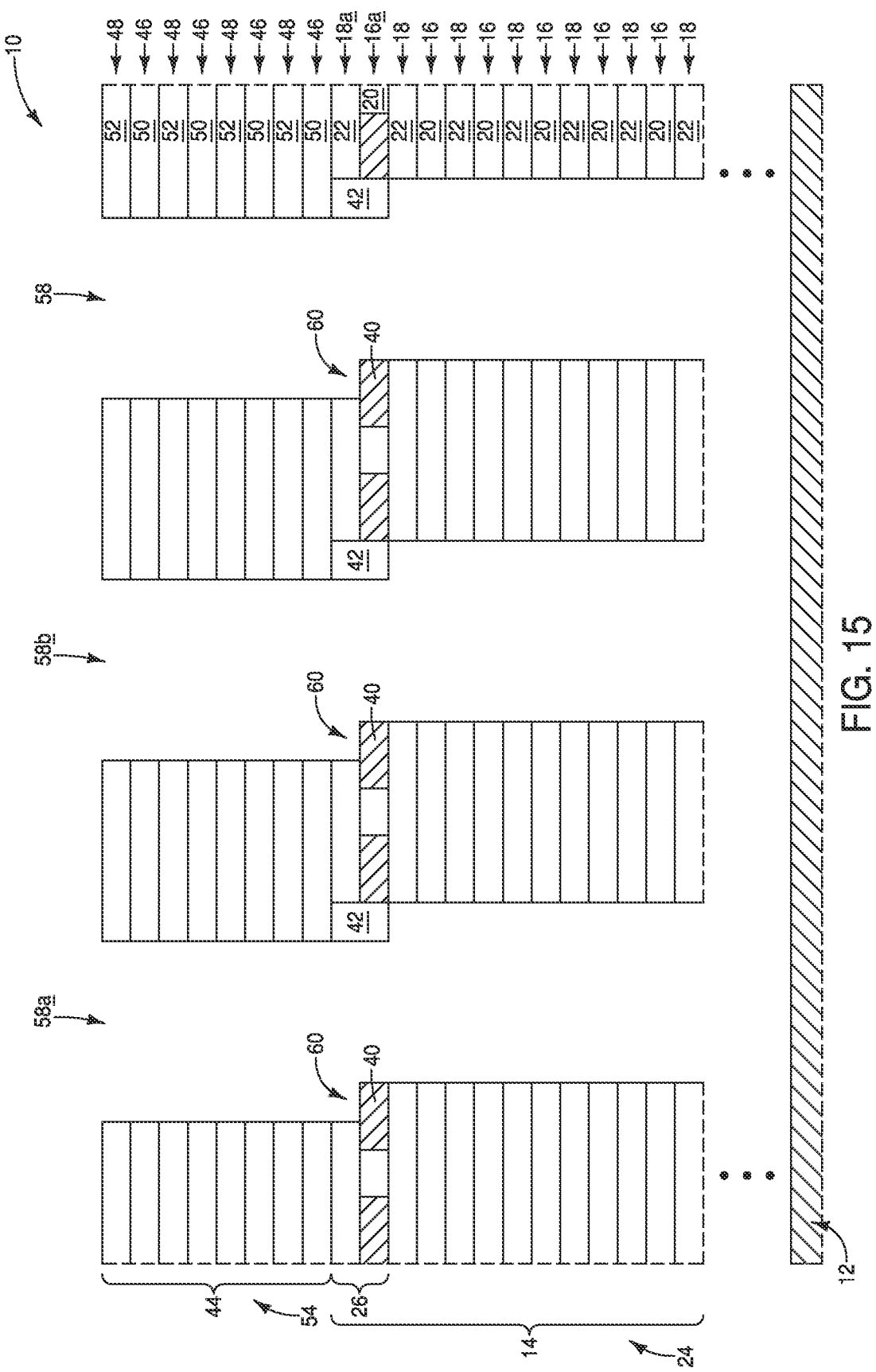

Referring to FIG. 15, the fill material 30 (FIG. 14) is removed. Accordingly, the first and second openings 56 and 28 join with the one another to form pillar openings 58 which extend through the first and second stacks 14 and 44. In some embodiments, the removal of the fill material at the processing stage of FIG. 15 may be considered to correspond to a step of extending the second openings 56 through the fill material.

Two of the pillar openings 58 may be considered together as a pair of the pillar openings, with such pair including a first pillar opening 58a and a second pillar opening 58b. The second pillar opening 58b is a neighbor to the first pillar opening 58a along the cross-section of FIG. 14. The first pillar opening 58a comprises combined openings 56a/28a (FIG. 14), and the second pillar opening 58b comprises combined openings 56b/28b (FIG. 14).

The material 40 forms steps 60 within the pillar openings 58 in the illustrated embodiment of FIG. 15.

Figure 16:
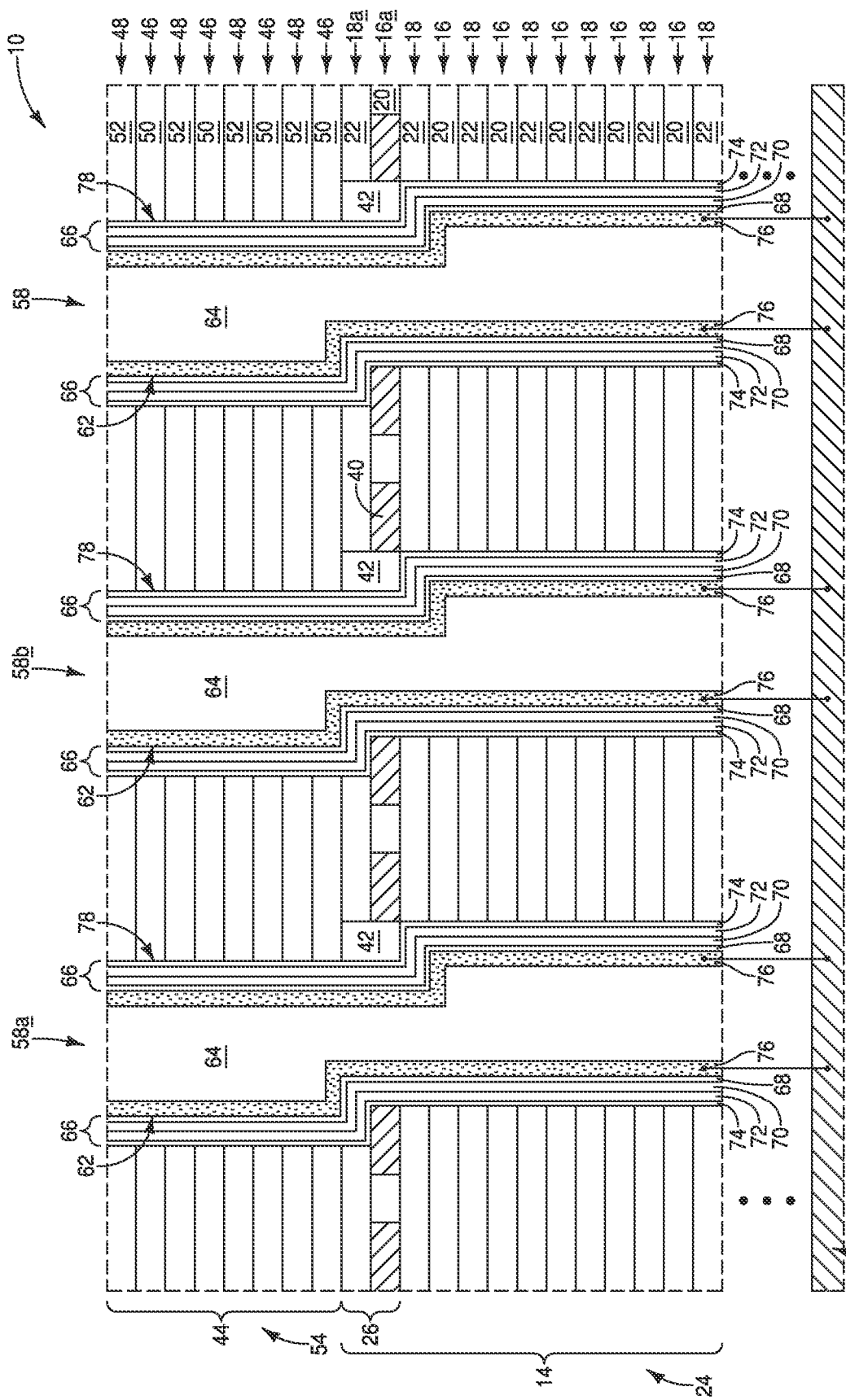

Referring to FIG. 16, channel-material-pillars 62 are formed within the pillar openings 58. The channel material pillars 62 may be considered to extend vertically through the first and second stacks 14 and 44, and are shown to be electrically coupled with the conductive structure 12.

The channel-material-pillars 62 are shown to be hollow, and to laterally surround an insulative material 64. The channel material-pillars 62 are offset from edges of the openings 58 by regions 66 comprising cell materials. The cell materials include gate-dielectric material (insulative material, tunneling material) 68, charge-storage material 70, charge-blocking material 72 and dielectric-barrier material 74.

The channel-material-pillars 62 comprise channel material 76. The channel material may comprise any suitable semiconductor composition(s). In some embodiments, the channel material 76 may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 76 may comprise silicon. The silicon may be in any suitable crystalline state (e.g., monocrystalline, polycrystalline, amorphous, etc.).

The gate-dielectric material (tunneling material) 68 may comprise any suitable composition(s); and in some embodiments may comprise one or more of silicon dioxide, silicon nitride, aluminum oxide, hafnium oxide, zirconium oxide, etc. In some embodiments, the material 68 may comprise a bandgap-engineered laminate.

The charge-storage material 70 may comprise any suitable composition(s), and in some embodiments may comprise charge-trapping material (e.g., one or more of silicon nitride, silicon oxynitride, conductive nanodots, etc.).

The charge-blocking material 72 comprise any suitable composition(s), and in some embodiments may comprise one or both of silicon dioxide and silicon oxynitride.

The dielectric-barrier material 74 may comprise any suitable composition(s); and may, for example, comprise one or more high-k compositions (e.g., aluminum oxide, hafnium oxide, zirconium oxide, etc.). The term "high-k composition" means a composition having a dielectric constant greater than the dielectric constant associated with silicon dioxide (i.e., greater than about 3.9). In some embodiments, the dielectric-barrier material 74 may be omitted from within the regions 66, and may instead be provided along the tiers 16 and 46 in subsequent processing (described below with reference to FIG. 18).

The insulative material 64 may comprise any suitable composition(s), and in some embodiments may comprise, consist essentially of, or consist of silicon dioxide. In some embodiments the insulative material 64 may be omitted and the channel-material-pillars 62 may be solid pillars, rather than being the illustrated hollow pillars.

In some embodiments, the cell materials 68, 70, 72 and 74 are formed within the openings 58 to line the openings, and then the channel material 76 is formed within the lined openings.

The materials within the regions 66, together with the channel material 76, may be considered to form cell-material-pillars 78 within the openings 58. If the insulative material 64 is present, such may also be considered to be part of the cell-material-pillars 78.

Figure 16A:
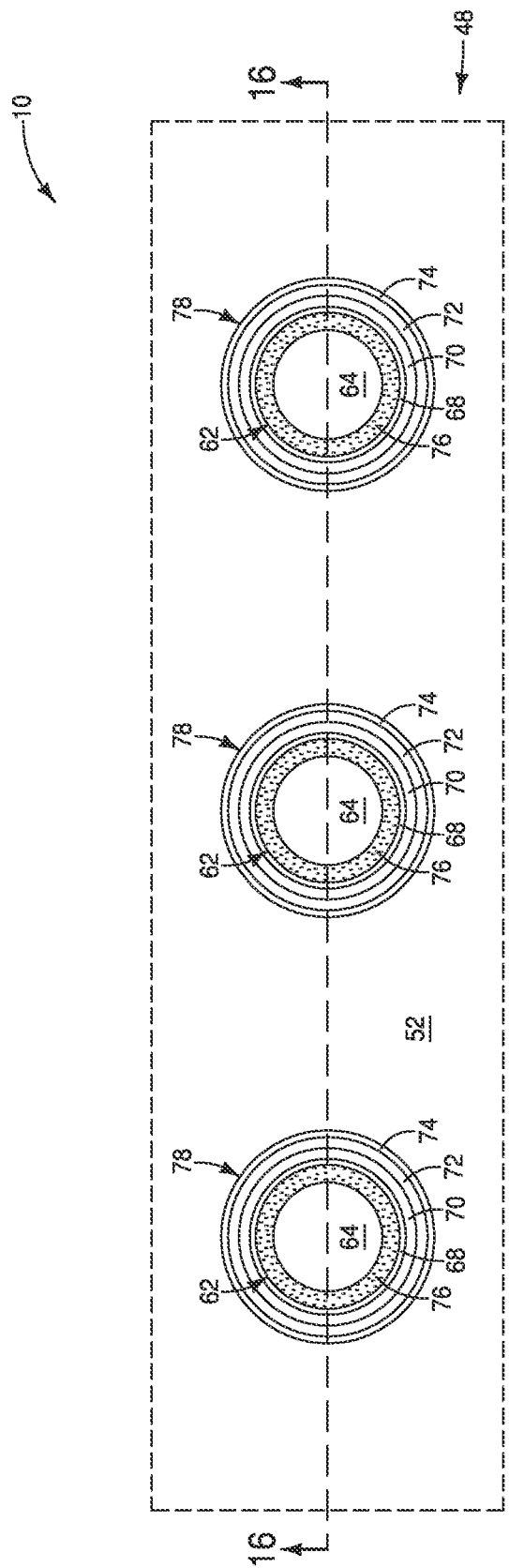
FIG. 16A is a diagrammatic top-down view of a region of the integrated assembly of FIG. 16; with the cross-section of FIG. 16 being along the line 16-16 of FIG. 16A.

FIG. 16A shows a top-down view of the assembly 10 along one of the tiers 48.

Figure 17:
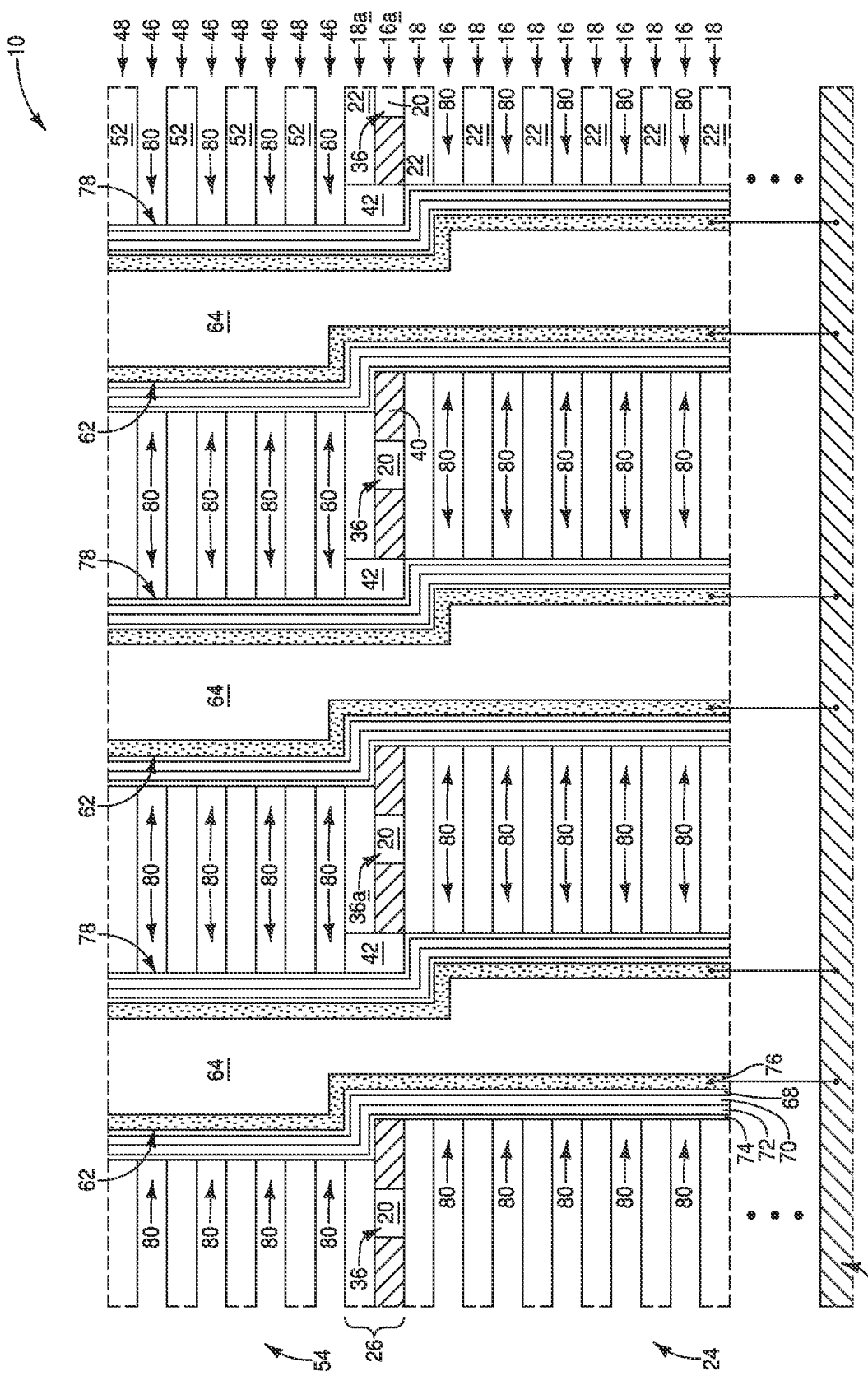
FIGS. 17 and 18 are diagrammatic cross-sectional side views of the region of the integrated assembly of FIG. 5 at example sequential process stages of an example method for forming an example memory array. The process stage of FIG. 17 may follow that of FIG. 16.

Referring to FIG. 17, the first and third materials 20 and 50 (FIG. 16) are removed to form voids 80 along the tiers (levels) 16 and 46. In some embodiments, the first and third materials 20 and 52 comprise of silicon nitride and are removed utilizing phosphoric acid.

The material 20 within the tier 16a (i.e., within the structures 36) may or may not be removed during the formation of the voids 80. If the material 20 is removed from within the tier 16a, then voids 80 will replace at least portions of the structures 36. The illustrated example embodiment of FIG. 17 shows the material 20 (i.e., the structures 36) remaining along the tier 16a after the formation of the voids 80.

Figure 18:
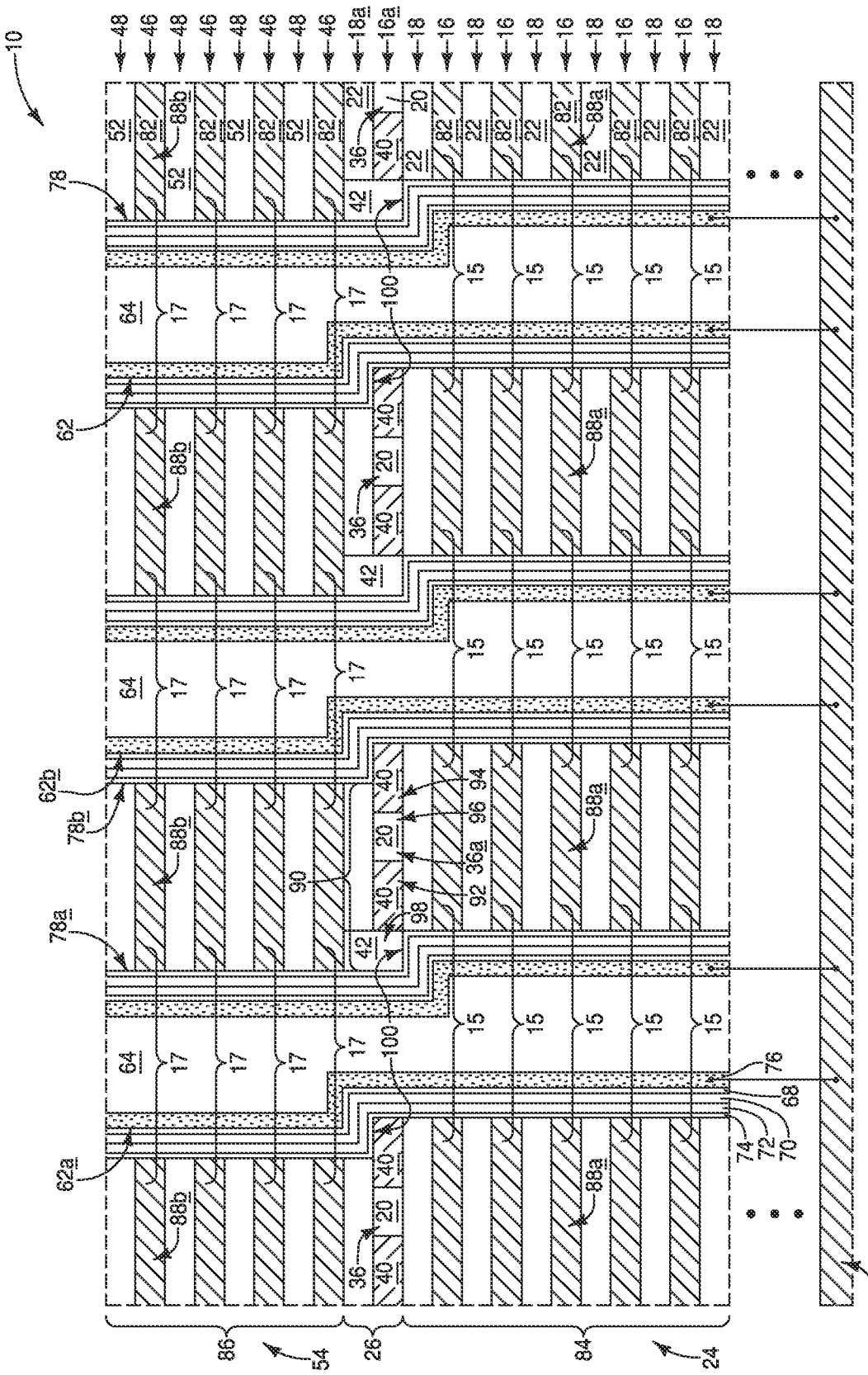

Referring to FIG. 18, conductive material 82 is formed within the voids 80 (FIG. 17). The conductive material 82 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 82 may comprise a metal-containing core (e.g., a tungsten-containing core), and a metal nitride (e.g., titanium nitride, tungsten nitride, etc.) along a periphery of the metal-containing core. In some embodiments, dielectric-barrier material may be formed within the voids 80 (FIG. 17) prior to forming the conductive material 82 within the voids. In such embodiments, the dielectric-barrier material 74 may or may not be formed within the openings 58 of FIG. 16.

The processing of FIGS. 17 and 18 may be considered to replace at least some of the first and third materials 20 and 50 (FIG. 16) with one or more conductive materials (e.g., the conductive material 82) to form the conductive levels 16 and 46 of FIG. 18.

The lower deck (first deck) 24 comprises a stack 84 of alternating conductive levels 16 and insulative levels 18, and the upper deck (second deck) 54 comprises a stack 86 of alternating conductive levels 46 and insulative levels 48. The conductive levels 16 of the first deck 24 may be referred to as first conductive levels (or first memory cell levels), and the conductive levels 46 of the second deck 54 may be referred to as second conductive levels (second memory cell levels).

The conductive material 82 may be considered to be configured as laterally-extending structures 88 (only some of which are labeled). The laterally-extending structures 88 within the first conductive levels 16 may be referred to as first conductive structures 88a, and the lateral-extending structures 88 within the second conductive levels 46 may be referred to as second conductive structures 88b. The conductive structures 88a within the first deck 24 vertically alternate with the first insulative levels 18, and the conductive structures 88b within the second deck 54 vertically alternate with the second insulative levels 48.

The intermediate region 26 may be considered to comprise an intermediate level 16a, with such intermediate level being between the first and second decks 24 and 54.

The cell-material-pillars 78 extend through the first and second decks 24 and 54, and through the intermediate level 16a. Two of the cell-material-pillars 78 may be considered together as a pair of the cell-material-pillars 78, with such pair including a first cell-material-pillar 78a and a second cell-material-pillar 78b. The second cell-material-pillar 78b is a neighbor to the first cell-material-pillar 78a along the cross-section of FIG. 18. The first cell-material-pillar includes a first channel-material-pillar 62a, and the second cell-material-pillar includes a second channel-material-pillar 62b.

First memory cells 15 are along the first conductive levels (first memory cell levels) 16, and second memory cells 17 are along the second conductive levels (second memory cell levels) 46. Each of the first and second memory cells includes a portion of a cell-material-pillar 78 and portions of the conductive levels. The memory cells 15 and 17 along the pillars 78 may correspond to vertical strings of memory cells suitable for utilization in NAND memory of the types described above with reference to FIGS. 1-4.

The first memory cells 15 may be considered to be arranged in first tiers (the levels 16), with such first tiers being disposed one atop another and being comprised by the first deck 24. The second memory cells 17 may be considered to be arranged in second tiers (the levels 46), with such second tiers being disposed one atop another and being comprised by the second deck 54.

The intermediate level 16a includes a region 90 between the first and second pillars 78a and 78b. The region includes first, second and third segments 92, 94 and 96 along the cross-section of FIG. 18. The first and second segments 92 and 94 comprise the material 40, and the third segment 96 comprises the material 20.

In some embodiments, the material 20 may be removed at the process stage of FIG. 17, and accordingly the segment 96 of FIG. 18 may correspond to a gas-filled void.

In some embodiments, the segments 92 and 94 may be considered to comprise a first composition, and the segment 96 may be considered to comprise a second composition which is different than the first composition. The first composition corresponds to the material 40. In some embodiments the second composition may correspond to material 20 (as shown), may comprise gas of a gas-filled void, or may comprise the conductive material 82 (as described in more detail below with reference to FIG. 19).

The segments 92 and 94 of FIG. 18 may be considered to be adjacent to the cell-material-pillars 78a and 78b, respectively. The second segment 94 is shown to be directly against the cell-material-pillar 78b, and the first segment 92 is shown to be spaced from the cell-material-pillar 78a by a fourth segment 98. The fourth segment 98 comprises the material 42. The fourth segment 98 is shown to be directly against both the first cell-material-pillar 78a and the first segment 92 along the cross-section of FIG. 18.

Figure 19:
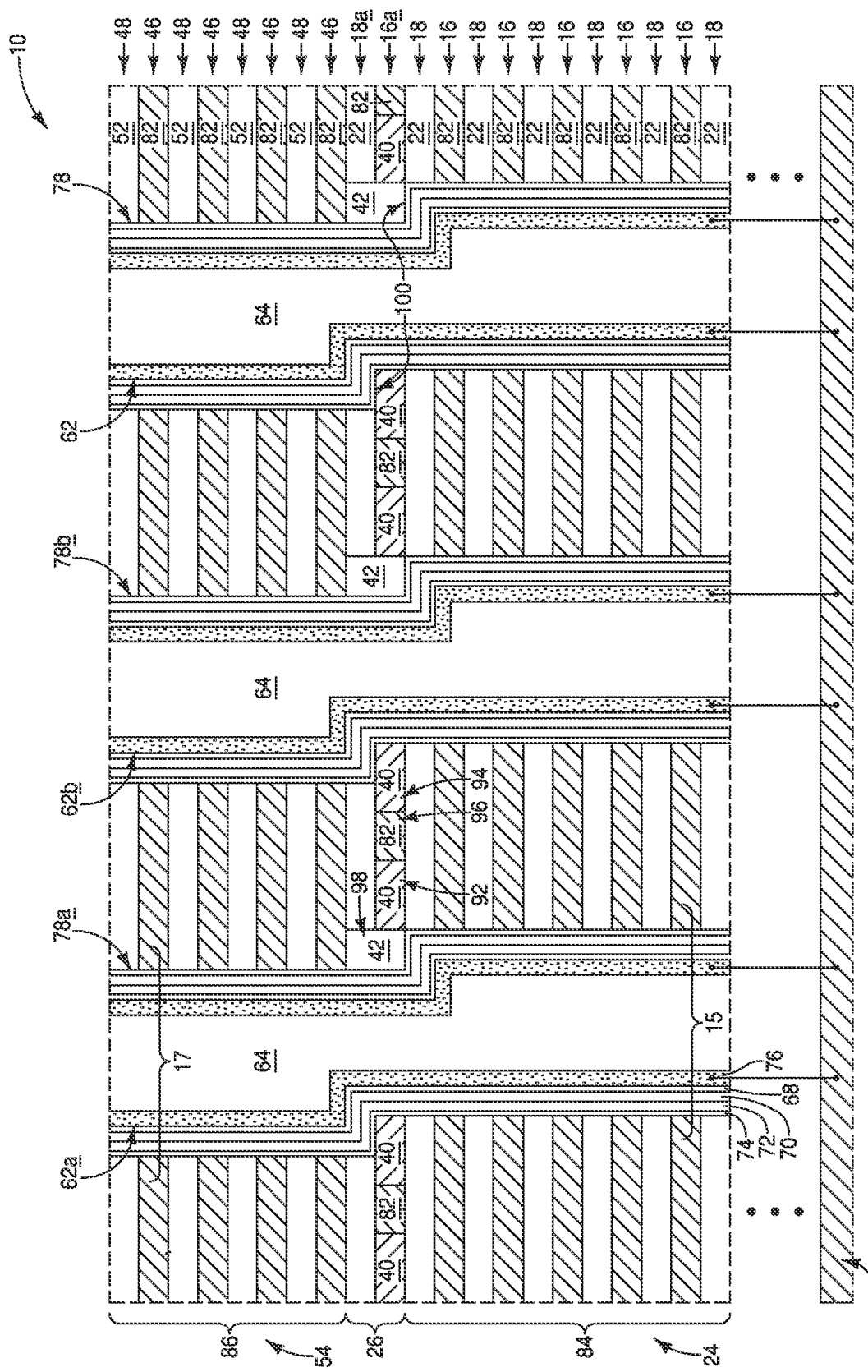
FIG. 19 is a diagrammatic cross-sectional side view of the region of FIG. 5 shown at an example process stage which may follow the process stage of FIG. 17 and which may be alternative to the process stage of FIG. 18.

In some embodiments, the material 20 along the intermediate level 16a may be replaced with the conductive material 82. Specifically, such material 20 may be removed during the formation of the voids 80 at the processing stage of FIG. 17, and then such voids may be filled with the conductive material 82 during the formation of the conductive material 82 along the levels 16 and 46. FIG. 19 shows the integrated assembly 10 at a process stage alternative to that of FIG. 18, and shows the conductive material 82 formed along the intermediate level 16a. The segments 96 thus comprise the material 82. In some embodiments, the material 82 may be a metal-containing material (e.g., a material comprising metal, metal nitride, metal carbide, metal silicide, etc.). For instance, the material 82 may comprise one or more of tungsten, titanium, tungsten nitride, titanium nitride, etc.

Figure 20:
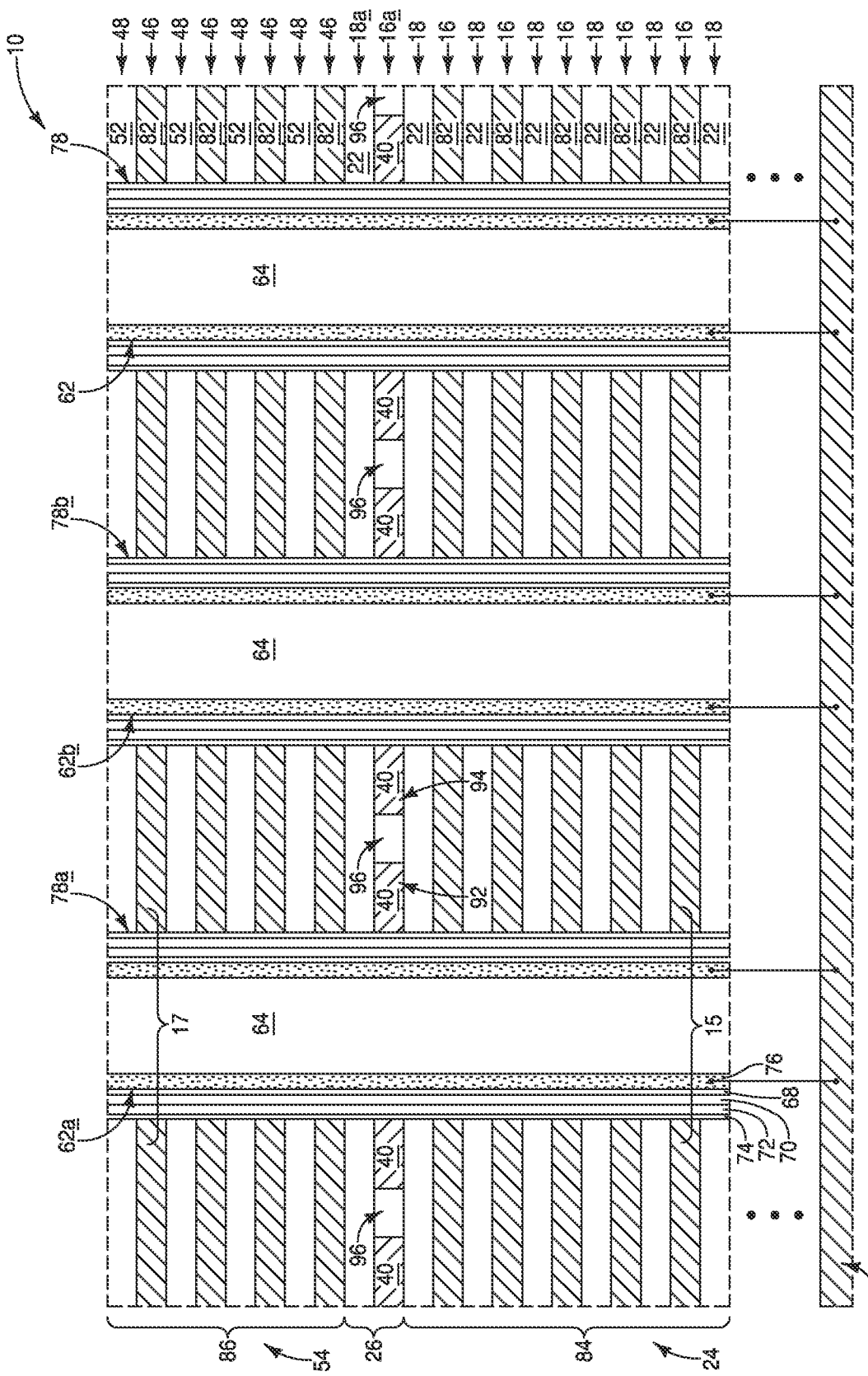
FIGS. 20 and 21 are diagrammatic cross-sectional side views of regions of example integrated assemblies.
Figure 21:
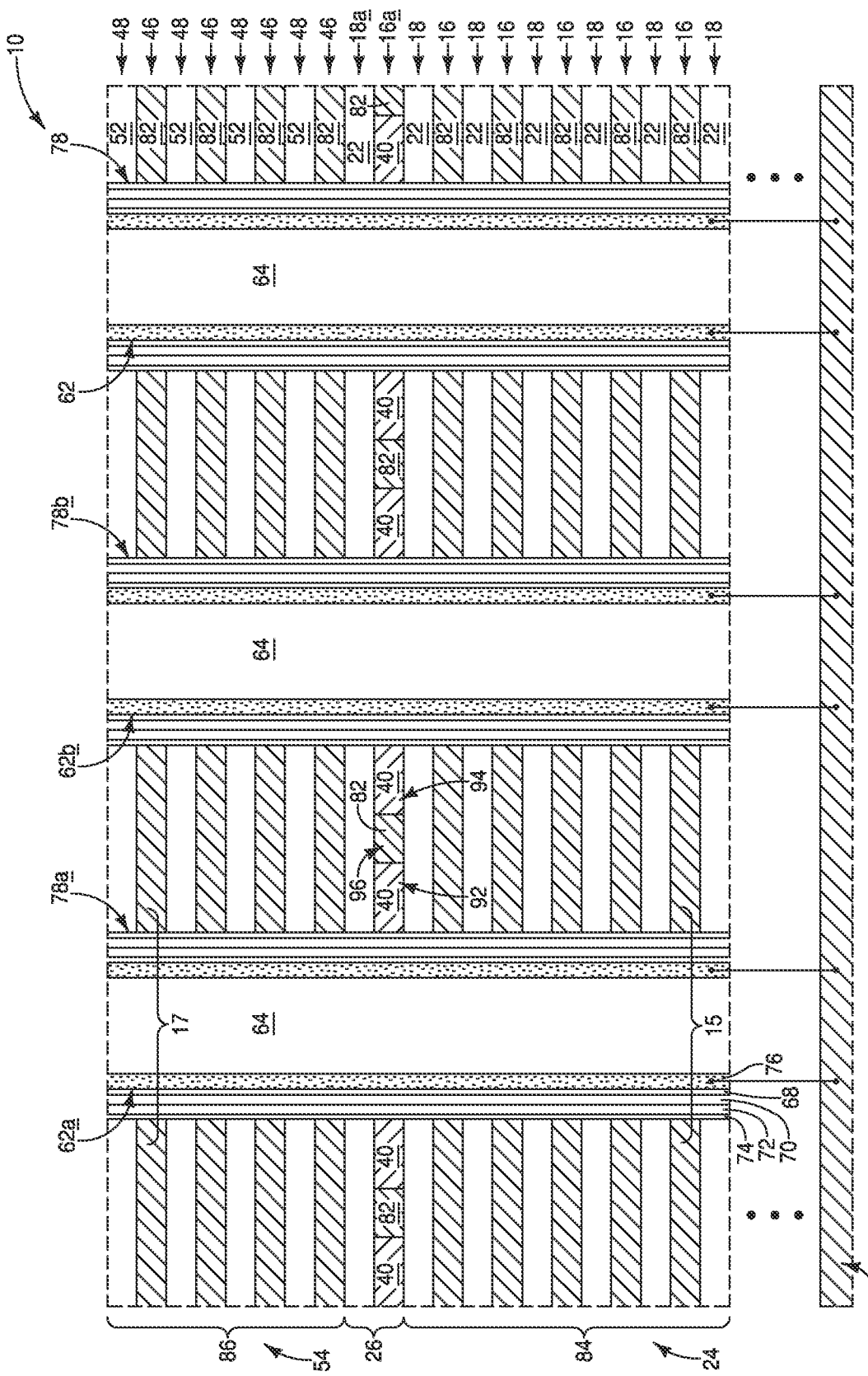

The embodiments of FIGS. 18 and 19 show assemblies resulting from having the second openings 56 (FIG. 14) misaligned relative to the first openings 28 (FIG. 14), and show the pillars 78 having steps 100 resulting from misalignment of regions of the pillars within the upper deck 54 relative to regions of the pillars within the lower deck 24. In other embodiments the second openings may not be misaligned relative to the first openings (i.e., may be aligned relative to the first openings). FIGS. 20 and 21 show integrated assemblies 10 analogous to those of FIGS. 18 and 19, respectively; but show embodiments in which the pillars 78 extend straight through the decks 24 and 54 rather than having the steps resulting from misalignment of the openings within the upper deck relative to the openings within the lower deck.

The segments 96 of FIG. 20 are left empty to indicate that such segments may correspond to gas-filled voids. Alternatively, the segments may comprise solid (or semisolid) material(s), such as the material 20 (e.g., silicon nitride) originally provided within the levels 18 and 48.

In some embodiments, the levels 16a of FIGS. 18-21 may be referred to as "dummy tiers" in that they are utilized for providing support rather than for providing functional circuitry (e.g., functional memory cells). In some embodiments, at least some of the conductive components of the levels 16a may be utilized for providing functional circuitry (e.g., for providing conductive interconnects).

Although only one of the levels of FIG. 18-20 is utilized for the immediate tier 16a, it is to be understood that in other embodiments multiple levels may be utilized for intermediate tiers 16a. For instance, in some applications a single level may not be sufficient to stop the misaligned etch described with reference to FIG. 14 and it may be desired to utilize multiple levels as intermediate tiers 16a.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an assembly. A first stack of alternating first and second tiers is formed. The first and second tiers include a first material and an insulative second material, respectively. One of the first tiers is an uppermost first tier. One of the second tiers is an uppermost second tier, and is above the uppermost first tier. A pair of first openings are formed to extend through the first stack. The first material of the uppermost first tier is recessed from sidewalls of the first openings to form cavities extending into the uppermost first tier. A region of the first material is between the cavities in a region between the first openings of said pair along a cross-section. First plug material is formed within the cavities. Upper regions of the first openings extend through the uppermost first and second tiers and have sidewalls which comprise both the second material of the uppermost second tier and the first plug material within the cavities. Second plug material is formed within the upper regions of the first openings. A second stack of alternating third and fourth tiers is formed over the first stack and over the second plug material. The third and fourth tiers comprise a third material and an insulative fourth material, respectively. A pair of second openings are formed to extend through the second stack to the second plug material. The second openings are extended through the second plug material. The extended second openings join with the first openings to form pillar openings which extend through the first and second stacks. Channel-material-pillars are formed within the pillar openings. At least some of the first and third materials are replaced with one or more conductive materials.

Some embodiments include an integrated assembly which has a second deck over a first deck. The first deck has first memory cell levels, and the second deck has second memory cell levels. A pair of cell-material-pillars pass through the first and second decks. Memory cells are along the first and second memory cell levels and include regions of the cell-material-pillars. The cell-material-pillars are a first pillar and a second pillar. An intermediate level is between the first and second decks. The intermediate level includes a region between the first and second pillars along a cross-section. The region includes a first segment adjacent the first pillar, a second segment adjacent the second pillar, and a third segment between the first and second segments. The first and second segments include a first composition, and the third segment includes a second composition different from the first composition.

Some embodiments include an integrated assembly which comprises a first deck having first memory cell levels alternating with first insulative levels. The first memory cell levels comprise laterally-extending first conductive structures which comprise conductive material. A second deck is over the first deck. The second deck has second memory cell levels alternating with second insulative levels. The second memory cell levels comprise laterally-extending second conductive structures which comprise the conductive material. A pair of cell-material-pillars pass through the first and second decks. Memory cells are along the first and second memory cell levels and comprise regions of the cell-material-pillars. The cell-material-pillars are a first pillar and a second pillar. An intermediate level is between the first and second decks. The intermediate level comprises a region between the first and second pillars along a cross-section. Said region includes a first segment adjacent the first pillar, a second segment adjacent the second pillar, and a third segment between the first and second segments. The third segment comprises a different composition than the first and second segments. The third segment comprises the conductive material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An apparatus, comprising:
a first deck having first memory cell levels;
a second deck over the first deck; the second deck having second memory cell levels;
a first cell-material-pillar and a second cell-material-pillar passing through the first and second decks; and
an intermediate level between the first and second decks; the intermediate level comprising a region between the first and second cell-material-pillars; said region including a first segment between the first cell-material-pillar and the second cell-material-pillar, a second segment between the first cell-material-pillar and the second cell-material-pillar, and a third segment between the first and second segments; the first segment comprising a first composition, the second segment comprising a second composition, and the third segment comprising a third composition different from the first composition and the second composition.

2. The apparatus of claim 1, wherein the first composition and the second composition are a same composition.

3. The apparatus of claim 2, wherein the first region is directly against the first cell-material-pillar and the second region is directly against the second cell-material-pillar.

4. The apparatus of claim 2, the same composition comprises one or both of TiN and WN, where the chemical formulas indicate primary constituents rather than specific stoichiometries.

5. The apparatus of claim 1 wherein a fourth segment is between the first segment and the first cell-material-pillar.

6. The apparatus of claim 5, wherein the second segment is directly against the second cell-material-pillar.

7. The apparatus of claim 5, wherein the fourth segment is directly against the first cell-material-pillar and directly against the first segment.

8. The apparatus of claim 1, wherein the apparatus comprises a 3D NAND memory device.

9. An apparatus, comprising:
a first deck having first memory cell levels;
a second deck over the first deck; the second deck having second memory cell levels;
a first and a second cell-material-pillar passing through the first and second decks; memory cells being along the first and second memory cell levels and comprising regions of the cell-material-pillars; and
an intermediate level between the first and second decks; the intermediate level comprising a region between the first and the second cell-material-pillar; said region including a first segment adjacent the first pillar, a second segment adjacent the second pillar, and a third segment between the first and second segments; the third segment comprising a different composition than the first and second segments.

10. The apparatus of claim 9, wherein the first deck comprises first insulative levels alternating with the first memory cell levels.

11. The apparatus of claim 10, wherein the second deck comprises second insulative levels alternating with the second memory cell levels.

12. The apparatus of claim 9, wherein the first and second memory cell levels comprise laterally extending conductive structures comprising a first conductive material; third segment comprising a second conductive material.

13. The apparatus of claim 12, wherein the first conductive material comprises a metal.

14. The apparatus of claim 13, wherein the second conductive material comprises the metal.

15. The apparatus of claim 13, wherein the metal comprises tungsten.

16. The apparatus of claim 9, further comprising a fourth segment between the first segment and the first cell-material-pillar.

17. The apparatus of claim 16, wherein the fourth segment comprises one or more of borophosphosilicate glass, fluorosilicate glass, and aluminum oxide.

18. The apparatus of claim 9, wherein the first and second cell-material-pillars correspond to respective strings of memory cells.

19. An apparatus, comprising:
a first group of memory cell levels;
a second group of memory cell levels formed over the first group;
a first and a second cell-material-pillar passing through the first and second groups of memory cell levels; and
an intermediate level between the first and second groups of memory cell levels; the intermediate level comprising a region between the first and the second cell-material-pillar; said region including a first plug adjacent the first pillar, a second plug adjacent the second pillar, and a material segment between the first and second plugs; the material segment comprising a different composition than the first and second plugs.

20. The apparatus of claim 19, wherein the material segment is a first material segment, and wherein the apparatus further comprises a second material segment located between the first plug and the first pillar, the second material segment comprising a different composition than the first material segment.

* * * * *